(12) United States Patent
Rajagopal et al.

(10) Patent No.: US 11,438,001 B2
(45) Date of Patent: Sep. 6, 2022

(54) GAIN MISMATCH CORRECTION FOR VOLTAGE-TO-DELAY PREAMPLIFIER ARRAY

(71) Applicant: Texas Instruments Incorporated, Dallas, TX (US)

(72) Inventors: Narasimhan Rajagopal, Chennai (IN); Chirag Chandrahas Shetty, Thane (IN); Neeraj Shrivastava, Bengaluru (IN); Prasanth K, Ottapalam (IN); Eeshan Miglani, Chhindwara (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/133,745

(22) Filed: Dec. 24, 2020

(65) Prior Publication Data
US 2022/0209782 A1 Jun. 30, 2022

(51) Int. Cl.
*H03M 1/34* (2006.01)
*H03M 1/12* (2006.01)
(Continued)

(52) U.S. Cl.
CPC ........... *H03M 1/1245* (2013.01); *H03K 5/24* (2013.01); *H03L 7/0812* (2013.01); *H03K 2005/00019* (2013.01)

(58) Field of Classification Search
CPC ........ H03M 1/206; H03M 1/50; H03M 1/365; H03M 1/002; H03M 1/361; H03M 1/0682;
(Continued)

(56) References Cited

U.S. PATENT DOCUMENTS

| | | |
|---|---|---|
| 4,612,533 A | 9/1986 | Evans |
| 4,899,071 A | 2/1990 | Morales |

(Continued)

FOREIGN PATENT DOCUMENTS

| | | |
|---|---|---|
| JP | H05206801 | 8/1993 |
| KR | 20000028857 | 5/2000 |

(Continued)

OTHER PUBLICATIONS

U.S. Appl. No. 16/517,796, Notice of Allowance, dated Feb. 6, 2020, p. 7.
(Continued)

*Primary Examiner* — Linh V Nguyen
(74) *Attorney, Agent, or Firm* — Mark A. Valetti; Charles A. Brill; Frank D. Cimino

(57) ABSTRACT

A method of using an analog-to-digital converter system includes receiving a sampled voltage corresponding to one of an input voltage and a known voltage, causing preamplifiers to generate output signals based on the sampled voltage, generating first and second signals based on the output signals, causing a delay-resolving delay-to-digital backend to generate a single-bit digital signal representing an order of receipt of the first and second signals, and adjusting one or more of the preamplifiers based on the digital signal. The disclosure also relates to a system which includes a voltage-to-delay frontend and a delay-resolving backend, and to a method which includes causing a delay comparator to generate a single-bit digital signal representing an order of receipt of input signals, causing the comparator to transmit a residue delay signal to a succeeding comparator, and transmitting a signal to adjust one or more of the preamplifiers based on the digital signal.

22 Claims, 14 Drawing Sheets

(51) Int. Cl.
*H03K 5/24* (2006.01)
*H03L 7/081* (2006.01)
*H03K 5/00* (2006.01)

(58) Field of Classification Search
CPC ........ H03M 1/46; H03M 1/1245; H03M 1/12;
H03M 1/468; H03M 1/00; H03M 1/0836;
H03M 1/1215; H03M 1/125; H03M 1/14;
H03M 1/141; H03M 1/181; H03M 1/362;
H03M 1/502; H03M 1/58; H03M 1/204;
H03G 3/001; H03G 3/30; H03G 1/0094;
H03G 3/20; H03F 1/26; H03F 2200/135;
H03F 2200/213; H03F 2200/411; H03F
2200/45; H03F 2203/45514; H03F
2203/45551; H03F 2203/7231; H03F
3/45475; H03F 3/72
USPC .................................. 341/118–121, 139–141
See application file for complete search history.

(56) References Cited

U.S. PATENT DOCUMENTS

| | | | |
|---|---|---|---|
| 4,928,103 A | 5/1990 | Lane | |
| 5,317,721 A | 5/1994 | Robinson | |
| 5,495,247 A | 2/1996 | Yamamoto et al. | |
| 5,563,533 A | 10/1996 | Cave et al. | |
| 5,821,780 A | 10/1998 | Hasegawa | |
| 6,002,352 A * | 12/1999 | El-Ghoroury | H03M 1/208 |
| | | | 341/139 |
| 6,046,612 A | 4/2000 | Taft | |
| 6,069,579 A * | 5/2000 | Ito | H03M 1/205 |
| | | | 341/155 |
| 6,124,746 A | 9/2000 | Van Zalinge | |
| 6,144,231 A | 11/2000 | Goldblatt | |
| 6,314,149 B1 | 11/2001 | Daffron | |
| 6,377,200 B1 | 4/2002 | Lee | |
| 6,822,596 B2 | 11/2004 | Theiler | |
| 6,836,127 B2 | 12/2004 | Marshall | |
| 6,857,002 B1 * | 2/2005 | Thomsen | H03H 17/0294 |
| | | | 708/305 |
| 7,046,179 B1 | 5/2006 | Taft et al. | |
| 7,233,172 B2 | 6/2007 | Kanamori et al. | |
| 7,262,724 B2 | 8/2007 | Hughes et al. | |
| 7,379,007 B2 | 5/2008 | Noguchi | |
| 7,405,689 B2 | 7/2008 | Kernahan et al. | |
| 7,501,862 B2 | 3/2009 | Su et al. | |
| 7,525,471 B2 | 4/2009 | Prodic et al. | |
| 7,557,746 B1 | 7/2009 | Waltari | |
| 7,737,875 B2 | 6/2010 | Waltari et al. | |
| 7,738,265 B2 | 6/2010 | Trattler | |
| 7,847,576 B2 | 12/2010 | Koiima | |
| 7,884,748 B2 * | 2/2011 | Delagnes | G04F 10/005 |
| | | | 375/331 |
| 7,916,064 B2 | 3/2011 | Lin et al. | |
| 7,919,994 B2 | 4/2011 | Walker | |
| 8,089,388 B2 | 1/2012 | Cui et al. | |
| 8,130,130 B2 | 3/2012 | Danjo et al. | |
| 8,183,903 B2 | 5/2012 | Glass et al. | |
| 8,373,444 B2 | 2/2013 | Lee et al. | |
| 8,421,664 B2 | 4/2013 | Ryu et al. | |
| 8,514,121 B1 * | 8/2013 | Shu | H03M 1/206 |
| | | | 341/155 |
| 8,773,169 B2 | 7/2014 | Dinc et al. | |
| 8,836,375 B2 | 9/2014 | Ghatak | |
| 8,896,476 B2 | 11/2014 | Harpe | |
| 9,369,137 B2 | 6/2016 | Masuko | |
| 9,379,007 B2 * | 6/2016 | Arvin | H01L 24/11 |
| 9,455,695 B2 | 9/2016 | Kull et al. | |
| 9,467,160 B2 * | 10/2016 | Chang | H03M 1/205 |
| 9,685,971 B2 * | 6/2017 | Harada | G11C 27/02 |
| 9,742,424 B2 | 8/2017 | Sharma et al. | |
| 9,917,590 B2 | 3/2018 | Zhang et al. | |
| 10,284,188 B1 | 5/2019 | Soundarajan et al. | |
| 10,673,452 B1 | 6/2020 | Soundararajan et al. | |
| 10,673,453 B1 | 6/2020 | Pentakota et al. | |
| 10,673,456 B1 | 6/2020 | Dusad et al. | |
| 10,778,243 B2 | 9/2020 | Pentakota et al. | |
| 10,958,258 B2 | 3/2021 | Soundararajan et al. | |
| 11,316,525 B1 * | 4/2022 | Pentakota | H03M 1/1019 |
| 11,316,526 B1 * | 4/2022 | Rajagopal | H03M 1/1047 |
| 2005/0104626 A1 | 5/2005 | Wakamatsu et al. | |
| 2006/0158365 A1 | 7/2006 | Kemahan et al. | |
| 2008/0297381 A1 | 12/2008 | Kemahan et al. | |
| 2009/0302888 A1 | 12/2009 | Shumarayev et al. | |
| 2010/0085101 A1 | 4/2010 | Walker | |
| 2010/0085232 A1 * | 4/2010 | Nicolas | H03M 1/362 |
| | | | 341/159 |
| 2012/0105264 A1 | 5/2012 | Ryu et al. | |
| 2012/0176158 A1 | 7/2012 | Lee et al. | |
| 2012/0212358 A1 | 8/2012 | Shi et al. | |
| 2012/0326904 A1 * | 12/2012 | Jensen | H03M 3/396 |
| | | | 341/131 |
| 2013/0009796 A1 | 1/2013 | Sakiyama et al. | |
| 2013/0021118 A1 | 1/2013 | Kabir et al. | |
| 2013/0169463 A1 | 7/2013 | Stein et al. | |
| 2014/0361917 A1 | 12/2014 | Matsuno et al. | |
| 2015/0008894 A1 | 1/2015 | Cannankurichi et al. | |
| 2015/0244386 A1 | 8/2015 | El-Chammas | |
| 2015/0260552 A1 | 9/2015 | Yao et al. | |
| 2019/0007071 A1 | 1/2019 | Nagarajan et al. | |
| 2019/0280703 A1 | 9/2019 | Naru et al. | |
| 2020/0195268 A1 | 6/2020 | Soundarajan et al. | |
| 2020/0204184 A1 | 6/2020 | Rattan | |

FOREIGN PATENT DOCUMENTS

| | | |
|---|---|---|
| KR | 2001044806 | 2/2001 |
| KR | 20020015863 | 3/2002 |

OTHER PUBLICATIONS

U.S. Appl. No. 16/410,698, Notice of Allowance, dated Feb. 10, 2020, p. 6.

International Search Report in corresponding PCT Patent Application No. PCT/2018-068162, dated Apr. 25, 2019 (2 pages).

U.S. Appl. No. 17/158,526, Notice of Allowance, dated Jan. 14, 2022, p. 8.

* cited by examiner

GAIN MISMATCH CORRECTION FOR VOLTAGE-TO-DELAY PREAMPLIFIER ARRAY

BACKGROUND

An analog-to-digital (A/D) converter (ADC) may be used to generate digital codes which represent the level of an analog signal. A radio-frequency (RF) sampling receiver may be used to receive and digitize a high frequency analog signal. An analog-to-digital converter for digitizing a signal in a radio-frequency sampling receiver may be required to operate at high speed. Analog-to-digital converters are described in United States Patent Application Publications Nos. 2012/0212358 (Shi et al.), 2015/0244386 (El-Chammas), 2019/0007071 (Nagarajan et al.), and 2019/0280703 (Naru et al.).

Some analog-to-digital converters have one or more voltage-to-delay (V2D) components and operate, at least in part, in a delay domain. Delay-based analog-to-digital converters are described in U.S. Pat. No. 10,673,452 (Soundararajan et al.), 10,673,456 (Dusad et al.), and 10,673,453 (Pentakota et al.). The entire disclosures of U.S. Pat. Nos. 10,673,452, 10,673,456, and 10,673,453 are incorporated herein by reference. In addition, the entire disclosures of the five U.S. patent applications identified below in Table 1 are incorporated herein by reference. Delay-based analog-to-digital converters may be operated, if desired, at high speed, with reduced area and power requirements.

TABLE 1

| Title | Inventors | Ser. No. |
|---|---|---|
| PIECEWISE CALIBRATION FOR HIGHLY NON-LINEAR MULTI-STAGE ANALOG-TO-DIGITAL CONVERTER | Narasimhan Rajagopal, Visvesvaraya Pentakota and Eeshan Miglani | 17/126,157 |
| DIFFERENTIAL VOLTAGE-TO-DELAY CONVERTER WITH IMPROVED CMMR | Prasanth K, Eeshan Miglani, Visvesvaraya Appala Pentakota, Kartik Goel, Venkataraman Jagannathan and Sai Aditya Nurani | |
| DELAY FOLDING SYSTEM AND METHOD | Eeshan Miglani, Visvesvaraya Pentakota and Chirag Chandrahas Shetty | 17/129,130 |
| SAMPLING NETWORK WITH DYNAMIC VOLTAGE DETECTOR FOR DELAY OUTPUT | Eeshan Miglani, Visvesvaraya Pentakota and Jaganathan Venkataraman | 17/131,981 |
| LOOKUP-TABLE-BASED ANALOG-TO-DIGITAL CONVERTER | Visvesvaraya Pentakota, Narasimhan Rajagopal, Chirag Shetty, Prasanth K, Neeraj Shrivastava, Eeshan Miglani and Jagannathan Venkataraman | |

SUMMARY

The present disclosure relates to a method of using an analog-to-digital converter system, which includes receiving a sampled voltage corresponding to one of an input voltage and a known voltage, causing preamplifiers to generate output signals based on the sampled voltage, generating first and second signals based on the output signals, causing a delay-resolving delay-to-digital backend to generate a single-bit digital signal representing an order of receipt of the first and second signals, and adjusting one or more of the preamplifiers based on the single-bit digital signal.

According to one aspect of the present disclosure, the analog-to-digital converter system includes a calibration engine/processor for establishing a known calibration voltage during calibration, for controlling a folding multiplexer and overriding its output during calibration, and for adjusting one or more preamplifiers for performance. The calibration engine/processor may include a digital processor. The present disclosure should not be limited, however, to these aspects of the present disclosure.

The present disclosure also relates to an analog-to-digital converter system which includes a voltage-to-delay frontend for receiving a sampled voltage corresponding to one of an input voltage and a known voltage, wherein the frontend includes preamplifiers for generating output signals based on the sampled voltage, and a folding multiplexer, connected to the preamplifiers, for generating first and second delay signals based on signals from one of the preamplifiers, and a delay-resolving delay-to-digital backend, connected to the frontend, for receiving the first and second delay signals from the frontend, wherein the backend includes a delay comparator for comparing timing of first and second inputs, and delay multiplexers, connected to the folding multiplexer, for generating the first and second inputs by multiplexing a third delay signal with the first and second delay signals.

The present disclosure also relates to a method of operating an analog-to-digital converter system, which includes causing a delay-based preamplifier array to receive a sampled voltage corresponding to one of an input voltage and a known voltage, wherein the preamplifier array includes preamplifiers having different threshold voltages, causing the preamplifiers to generate output signals based on the sampled voltage, generating first and second signals based on the output signals, and applying the first and second signals to a delay-resolving delay-to-digital converter backend, which includes a delay comparator, causing the delay comparator to generate a single-bit digital signal representing an order of receipt of the first and second signals, causing the delay comparator to transmit a residue delay signal to a succeeding delay comparator, and causing a calibration engine/processor to transmit a signal to the preamplifiers to adjust one or more of the preamplifiers based on the single-bit digital signal.

BRIEF DESCRIPTION OF THE DRAWINGS

Like elements are designated by like reference numerals and other characters throughout the drawings.

DETAILED DESCRIPTION

Figure 1:
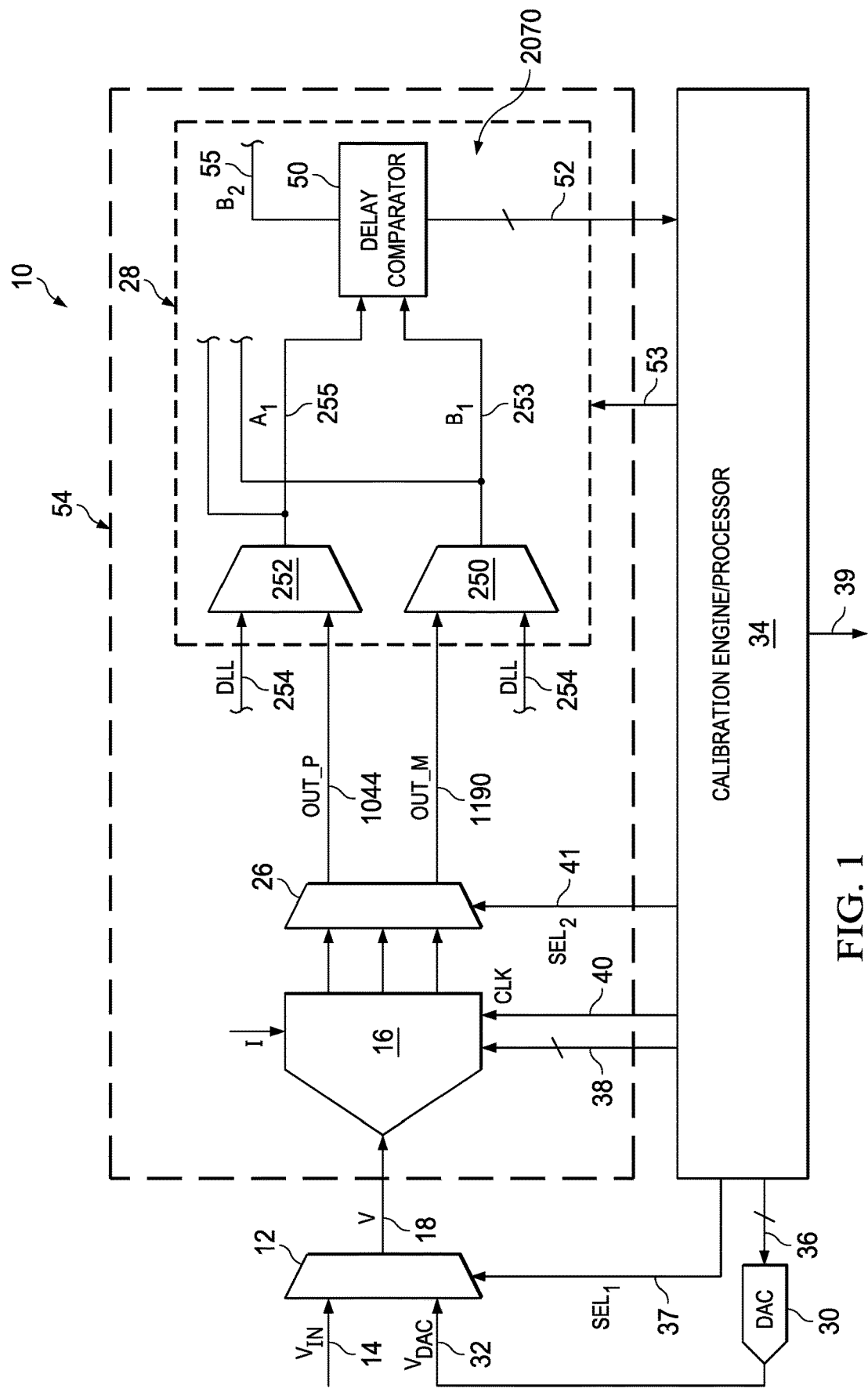
FIG. 1 is a block diagram of an example of a delay-based analog-to-digital converter system.

FIG. 1 illustrates an analog-to-digital converter system 10 constructed in accordance with the present disclosure. The analog-to-digital converter system 10 has a multiplexer 12 for receiving an input voltage VIN on an input line 14, and a voltage-to-delay preamplifier array 16 for receiving a sampled voltage V from the multiplexer 12 on a sampled voltage line 18. The multiplexer 12 may include an analog multiplexer.

Figure 2:
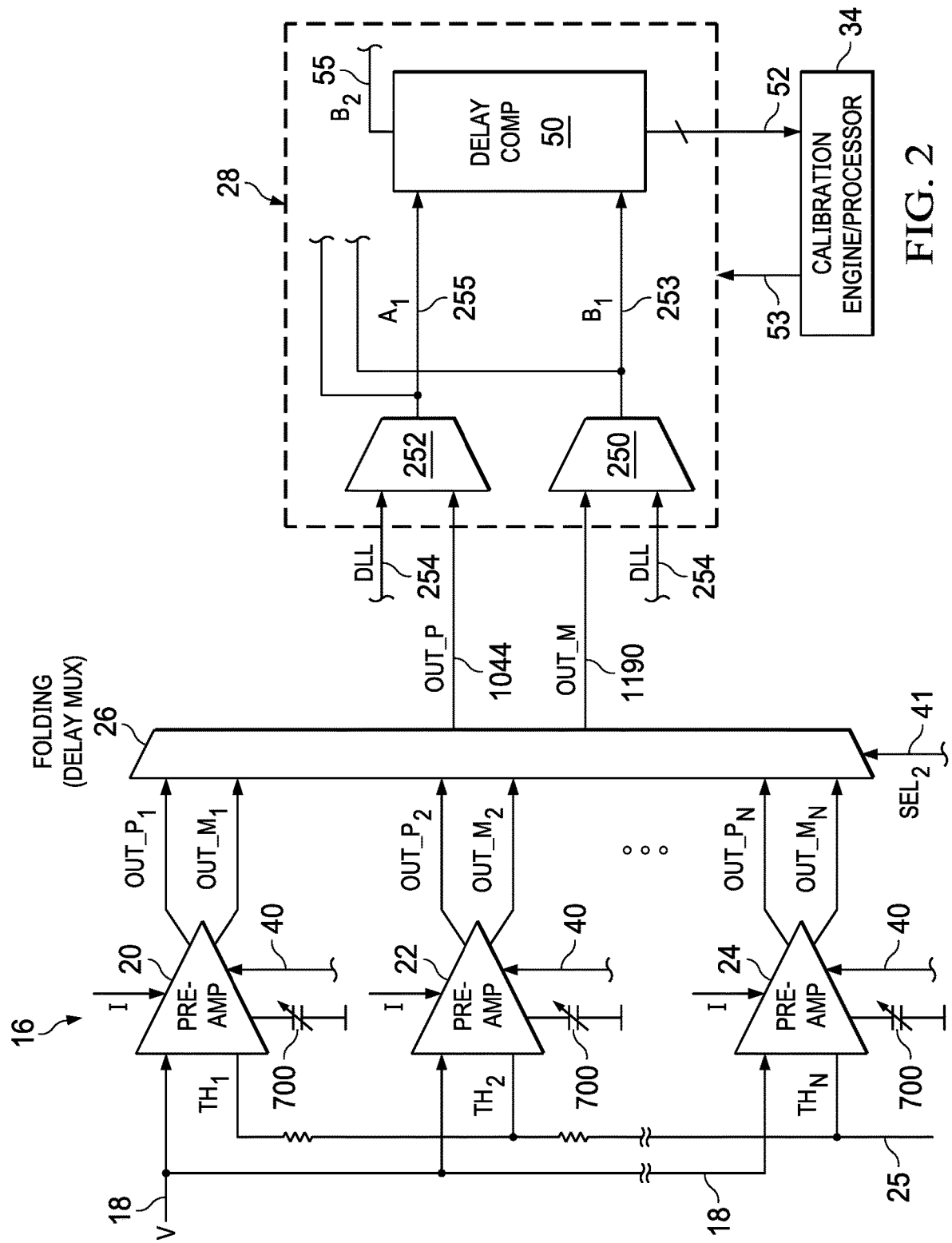
FIG. 2 is a block diagram of a portion of the analog-to-digital converter system of FIG. 1.

As illustrated in FIG. 2, the preamplifier array 16 has first and second through Nth preamplifiers 20, 22 and 24 (N=3, 4, 5 or more). In operation, the preamplifiers 20, 22 and 24 generate first and second output signals OUT_$M_1$, OUT_$P_1$, OUT_$M_2$, OUT_$P_2$, OUT_$M_N$ and OUT_$P_N$ based on differences between the sampled voltage V and threshold voltages $TH_1$, $TH_2$ and $TH_N$ ($TH_1 < TH_2 < TH_N$) applied to the preamplifiers 20, 22 and 24. In the illustrated configuration, the threshold voltages $TH_1$, $TH_2$ and $TH_N$ are applied to the preamplifiers 20, 22 and 24 by a suitable voltage divider 25. The present disclosure should not be limited, however, to the illustrated configuration. If desired, all or some of the preamplifiers 20, 22 and 24 may be threshold-integrated preamplifiers.

The analog-to-digital converter system 10 (FIG. 1) also has a folding delay multiplexer 26, which receives the output signals OUT_$M_1$, OUT_$P_1$, OUT_$M_2$, OUT_$P_2$, OUT_$M_N$ and OUT_$P_N$ (FIG. 2). In an operational phase, the folding delay multiplexer 26 generates first and second delay signals OUT_M and OUT_P (on lines 1190 and 1044) corresponding to the output signals of the most relevant one of the preamplifiers 20, 22 and 24 (that is, the one preamplifier within the array 16 whose threshold voltage is closest to the sampled voltage V).

Figure 14:
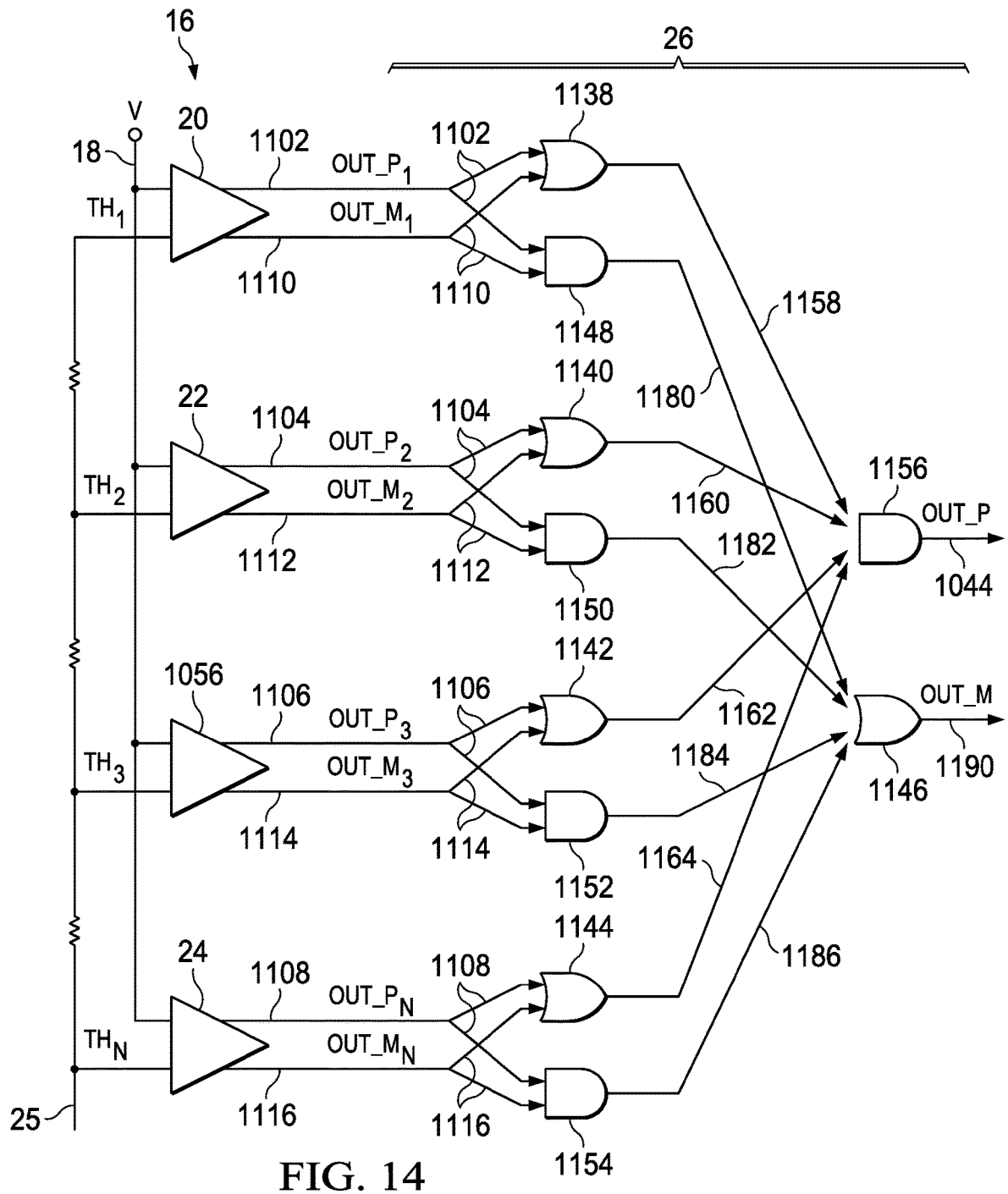
FIG. 14 is a block diagram of a preamplifier array and a folding delay multiplexer for the analog-to-digital converter system of FIG. 1.

An example of a folding circuit of the folding delay multiplexer 26 is illustrated in FIG. 14 and is described in more detail below. The delay multiplexer 26 is a data selector in the delay domain (where information is represented by delay). The delay multiplexer 26 selects one pair of delay signals from several pairs of delay signals and outputs a single pair of signals with delay corresponding to the selected pair of signals. The illustrated delay multiplexer 26 uses logic gates to perform a folding process as shown in FIG. 14 and as described in more detail below.

In the example illustrated in FIG. 2, if the sampled voltage V is closer to the threshold voltage $TH_1$ of the first preamplifier 20 than it is to any of the other threshold voltages $TH_2$ and $TH_N$, then the first preamplifier 20 is the most relevant preamplifier within the array 16, and the relative timings of the leading edges of the delay signals OUT_M and OUT_P correspond to the relative timings of the leading edges of the first and second output signals OUT_$M_1$ and OUT_$P_1$ of the first preamplifier 20.

On the other hand, if the sampled voltage V is closer to the threshold voltage $TH_2$ of the second preamplifier 22 than it is to any of the threshold voltages $TH_1$ and $TH_N$ of the other preamplifiers 20 and 24, then the second preamplifier 22 is the most relevant preamplifier, and the relative timings of the leading edges of the delay signals OUT_M and OUT_P correspond to the relative timings of the leading edges of the output signals OUT_$M_2$ and OUT_$P_2$ of the second preamplifier 22.

The analog-to-digital converter system 10 (FIG. 1) also has an analog-to-digital converter backend 28 for receiving and processing input signals on lines 253 and 255 where the input signals (253 and 255) are based at least in part on the delay signals OUT_M and OUT_P. The analog-to-digital converter backend 28 generates digital signals (codes) that are transmitted to a calibration engine/processor 34 on a suitable line 52. Timing control for the analog-to-digital converter backend 28 is provided by the calibration engine/processor 34 on another suitable line 53.

The analog-to-delay converter backend 28 has a first delay comparator 50 for generating a single-bit digital signal on line 52 to indicate which one of the delay signals OUT_M and OUT_P (or, which one of the signals on lines 253 and 255) reaches the delay comparator 50 first. The digital signal on line 52 is representative of the order in which signals (253 and 255) are received at the delay comparator 50. A residue delay signal is output from the first delay comparator 50, on a suitable line 55, to a second delay comparator (not illustrated in FIGS. 1 and 2). Examples of the structure and operation of the delay comparator 50, the second delay comparator, and successive comparators are illustrated in FIGS. 15-18.

In the illustrated configuration, the delay-resolving back-end 28 includes a cascade of delay-based stages. The first delay-based stage 2070 (FIG. 15) is connected to successive delay-based stages by the suitable line 55. In the example shown in FIG. 15 all of the delay-based stages are single-bit stages. According to other aspects of the present disclosure, the delay-resolving back end 28 may have one or more multi-bit stages. For example, one or more delay-based stages may be two-bit stages and/or one or more delay-based stages may be four-bit stages. For example, the first stage 2070 may be a single-bit stage, while second, third, and fourth successive stages may be four-bit, single-bit, and two-bit stages, respectively, and residual delay-based stages after the fourth stage may all be single-bit stages. Each stage may have one or more delay comparators. Thus, the analog-to-digital converter backend 28 may have two, three, four or more delay comparators. Digital signals generated by the delay comparators are used by the calibration engine/processor 34 to determine less significant bits of the value of the sampled voltage V.

During a calibration phase, a digital (whether binary, hexadecimal or other format) version of known voltage $V_{DAC}$ is established by a digital code generated by the calibration engine/processor 34 and output on line 36. Digital-to-analog (D/A) converter (DAC) 30 (FIG. 1) converts the digital version of known voltage $V_{DAC}$ to analog and outputs this signal on a second input line 32 of multiplexer 12. The multiplexer 12 selects and applies either the input voltage VIN or the known voltage $V_{DAC}$ to the sampled voltage line 18 (as the sampled voltage V), under the control ($SEL_1$ signal) of the calibration engine/processor 34, via a control line 37.

During the operational phase of the analog-to-digital converter system 10, the input voltage VIN is transmitted (as the sampled voltage V) to the preamplifier array 16, and a digital code representative of the input voltage VIN is generated by the calibration engine/processor 34, using digital information received from the preamplifier array 16 and the comparators of the backend 28, as described in more detail below. The representative digital code is output on an output line 39.

In the example illustrated in FIG. 1, during the operational phase, a select signal $SEL_1$ on the control line 37 is low ("0"), such that the sampled voltage V equals, or corresponds to, the input voltage VIN, but during the calibration phase, the select signal $SEL_1$ is high ("1"), such that the sampled voltage V equals, or corresponds to, the known voltage $V_{DAC}$. The select signal $SEL_1$ is generated by the calibration engine/processor 34.

The preamplifier array 16 is configured to generate digital signals that are transmitted to the calibration engine/processor 34 on a suitable line 38 (FIG. 1). The digital signals may be used to determine the most significant bit or bits of the value of the sampled voltage V, and to identify the most relevant preamplifier within the preamplifier array 16 (that is, the preamplifier which generates the most significant delay information). The voltage-to-delay preamplifier array 16 is operated under the control of a suitable timing signal CLK (FIG. 3) generated by the calibration engine/processor 34. The timing signal CLK is transmitted to the preamplifiers 20, 22 and 24 (FIG. 2) on a suitable line 40.

Figure 3:
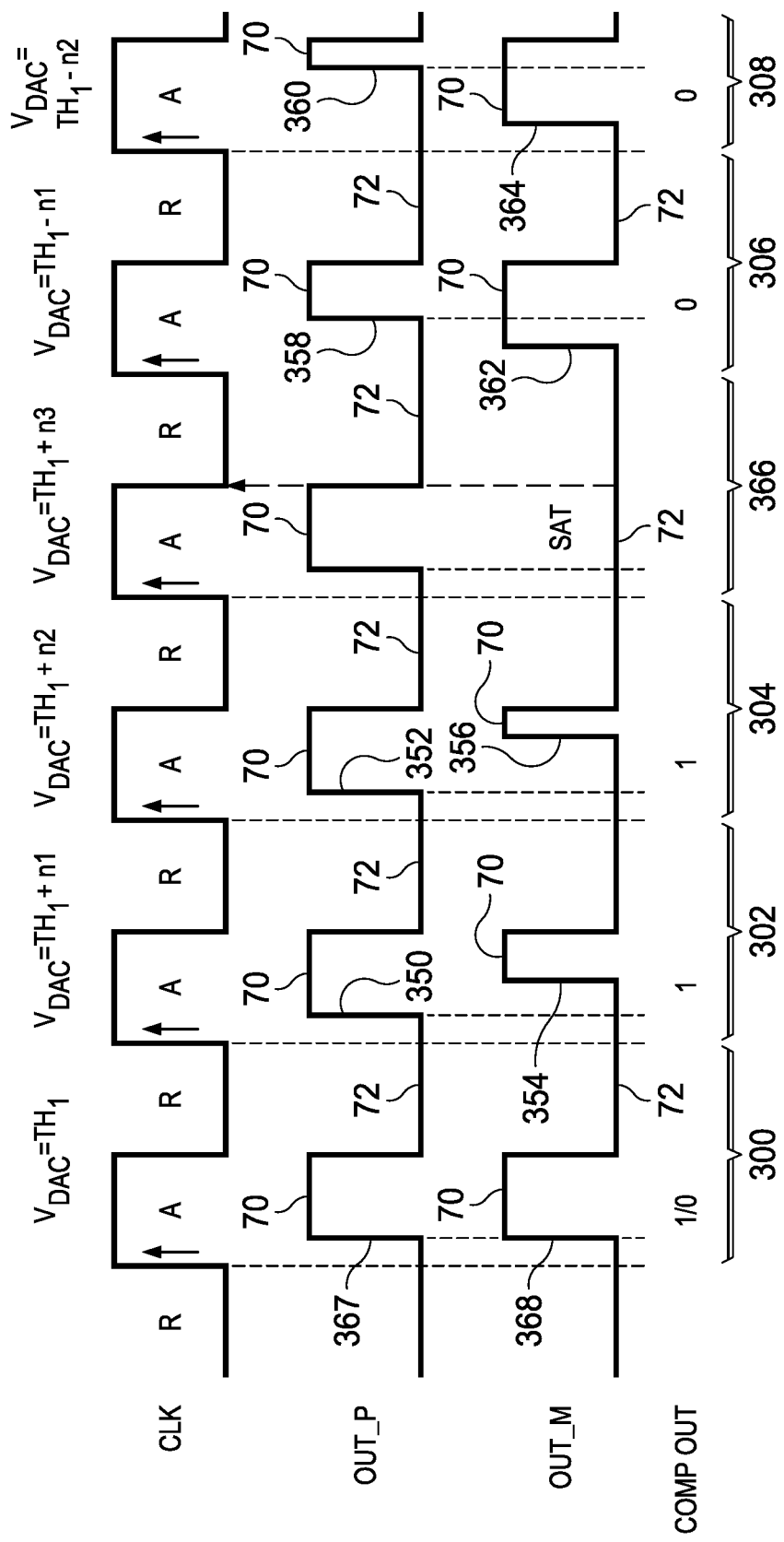
FIG. 3 is a timing diagram for threshold correcting and saturation detection processes for the analog-to-digital converter system of FIG. 1.

In the example illustrated in FIG. 3, when the timing signal CLK is high ("1"), the analog-to-digital converter system 10 is in an active phase A, and the delay signals OUT_M and OUT_P may have high components 70 and low components 72. When the timing signal CLK is low ("0"), the analog-to-digital converter system 10 is in a reset phase R, and all components of the delay signals OUT_M and OUT_P are low (72). In an operational phase, the timings of the leading edges of the delay signals OUT_M and OUT_P correspond to the timings of the leading edges of the output signals from the most relevant preamplifier within the array 16. At the start of each reset phase R, the timing signal CLK (on line 40) causes the preamplifiers 20, 22 and 24 to reset. As a result, the delay signals OUT_M and OUT_P are both low (72) throughout each reset phase R.

The folding delay multiplexer 26 (FIG. 2) is operated under the control of one or more signals, including a second select signal $SEL_2$, from the calibration engine/processor 34, on line 41. In an operational phase, the folding delay multiplexer 26 causes the delay signals OUT_M and OUT_P to be based on the corresponding output signals from the most relevant preamplifier within the array 16. In the calibration phase, the calibration engine/processor 34 can override the selection and select any one of the preamplifiers 20, 22 and 24 instead of the most relevant preamplifier.

In summary, the analog-to-digital converter system 10 has a voltage-to-delay preamplifier array frontend (including preamplifiers 16 and multiplexer 26) followed by a delay-resolving analog-to-digital backend 28. One or more elements of the frontend 16, 26 and the backend 28 may be integrated into an integrated circuit (IC) 54 and/or formed on or over a single semiconductor die (not shown in the drawings) according to various semiconductor and/or other processes. The conductive lines may be metal structures formed in insulating layers over the semiconductor die, doped regions (that may be silicided) formed in the semiconductor die, or doped semiconductor structures (that may be silicided) formed over the semiconductor die. Transistors used to implement the circuit structures of the example embodiments may be bipolar junction transistors (BJT) or metal-oxide-semiconductor field-effect transistors (MOSFET) and can be n-type or p-type. The integrated devices and elements may also include resistors, capacitors, logic gates, and other suitable electronic devices that are not shown in the drawings for the sake of clarity.

The first delay-based stage 2070 (FIG. 15) is connected (by lines 253 and 255) to the folding delay multiplexer 26. The successive delay-based stages are connected (by lines 55 and 57) to the first delay-based stage 2070. In operation, the analog-to-digital backend 28 generates digital signals based on the selected delay signal, and, in the calibration phase, one or more of the illustrated preamplifiers 20, 22 and 24 is adjusted based on the digital signals output by the analog-to-digital backend 28. The present disclosure should not be limited, however, to the configuration illustrated in the drawings and described by way of example herein.

If desired, the analog-to-digital converter system 10 may be operated at high speed (for example, >3 GSPS) and with high performance (for example, >55 dBFS). Moreover, if desired, the analog-to-digital converter system 10 may consume less power than a conventional pipeline-based analog-to-digital converter. A delay-based analog-to-digital converter system constructed in accordance with the present disclosure may be used, if desired, to overcome barriers of speed, area, and power that are characteristic of conventional analog-to-digital converters.

The preamplifiers 20, 22 and 24 (FIG. 2) within the array 16 have varying gains as a result of various factors, which may include design, process, input voltage VIN, and/or temperature. According to one aspect of the present disclosure, the gains and ranges of the preamplifiers 20, 22 and 24 may be adjusted, and preferably matched across the preamplifier array 16. The preamplifiers 20, 22 and 24 may be first calibrated, then adjusted for maximum, or improved, gain, and then corrected for gain mismatch across the array 16, all while avoiding a saturation condition. Gain mismatch should be avoided because, among other reasons, it could prevent the most relevant preamplifier from being selected by the folding delay multiplexer 26. In particular, gain mismatch could potentially cause a preamplifier other than the most relevant preamplifier to generate delay signals that are the latest of the earliest, and the earliest of the latest, of the signals generated by the preamplifiers in the array.

Threshold voltage calibration may be achieved by applying suitable offset voltages (having values of n1, n2, n3 . . . ) to the threshold voltage for the most relevant preamplifier within the array 16. The offset which causes the digital output of the first delay comparator 50 (on line 52) to toggle (that is, to change from high ("1") to low ("0") and vice versa) is then used as the offset to calibrate the most relevant preamplifier. The example illustrated in FIG. 3 assumes that the first preamplifier 20 is the most relevant preamplifier within the array 16 (that is, that the threshold voltage $TH_1$ of the first preamplifier 20 is closer to the sampled voltage V than are the thresholds $TH_2$ and $TH_N$ of the other preamplifiers 22 and 24). When the sampled voltage V is closer to another threshold, then the preamplifier whose threshold voltage is closest to the sampled voltage V is the most relevant preamplifier.

As indicated above, during the calibration phase, the select signal $SEL_1$ is high ("1"), such that the sampled voltage V equals, or corresponds to, the known voltage $V_{DAC}$. In the example illustrated in FIG. 3, the analog-to-digital converter system 10 is in the calibration phase, and therefore the first select signal $SEL_1$ is high. Moreover, in the illustrated example, the sampled voltage V (=$V_{DAC}$ during calibration) is equal to the threshold voltage $TH_1$ of the first preamplifier 20 (causing the first preamplifier 20 to be the most relevant preamplifier within the array 16), and voltage offsets, whose values are 0, n1, n2, n3, −n1 and −n2 (where 0<n1<n2<n3), are added, one at a time, to the threshold voltage $TH_1$. In the illustrated example, the single-bit digital output of the first delay comparator 50, on line 52, toggles when the voltage offset is 0 (as shown in region 300 in FIG. 3), indicating that the first preamplifier 20 does not need any threshold voltage correction. In the illustrated example, when the value of the offset is n1 or n2 (as shown in regions 302 and 304), the comparator output (Comp Out) on line 52 is high ("1"), because the leading edge 350, 352 of the second delay signal OUT_P precedes the corresponding leading edge 354, 356 of the first delay signal OUT_M, but when the value of the offset is −n1 or −n2 (as shown in regions 306 and 308), the comparator output on line 52 is low ("0"), because the leading edge 358, 360 of the second delay signal OUT_P trails the leading edge 362, 364 of the first delay signal OUT_M.

In the example illustrated in FIG. 3, when the value of the offset is 0 (as shown in region 300), the comparator output on line 52 toggles high/low, because the leading edge 366 of the second delay signal OUT_P coincides with the leading edge 368 of the first delay signal OUT_M. Therefore, in the example illustrated in FIG. 3, the threshold voltage $TH_1$ of the first preamplifier 20 does not need correction, and an offset voltage equal to 0 is applied to the threshold voltage $TH_1$.

In a different example, if it is determined that applying an offset voltage value of n1 or n2 causes the first preamplifier 20 to toggle the digital output (52) of the first delay comparator 50, then the threshold voltage $TH_1$ of the first preamplifier 20 is corrected to $TH_1$+n2 or $TH_1$+n3, respectively. The offset correction process may be repeated for each one of the preamplifiers 20, 22 and 24 within the array 16. Thus, each preamplifier threshold voltage may be corrected during the calibration phase by setting the digital-to-analog converter 30 so that the known voltage $V_{DAC}$ equals an ideal threshold, and then correcting bulk voltage until the bit generated by the first delay comparator 50 flips from high to low (or from low to high).

After the threshold voltages $TH_1$, $TH_2$ and $TH_N$ of the preamplifiers 20, 22 and 24 are corrected (to the extent required) by the application of suitable offsets, three adjustment processes may be performed. The three adjustment processes are as follows: One (referred to as "Process One"), maximizing (or at least increasing, if possible) gain of each one of the preamplifiers 20, 22 and 24. Two (referred to as "Process Two"), normalizing (or at least improving normalization of) gains of first and second zones within each one of the preamplifiers 20, 22 and 24. Three (referred to as "Process Three"), normalizing (or at least improving normalization of) gain across the preamplifier array 16. According to a preferred sequence, calibration and maximization of gains of the preamplifiers 20, 22 and 24 occur first, and then gain mismatches across the preamplifier array 16 are corrected. After, or in connection with, each one of the three adjustment processes, a saturation check (discussed in more detail below) may be performed and appropriate action may be taken in response to the saturation check. For example, if a saturation condition is detected, action may be taken to avoid such a condition, as discussed below.

The threshold voltage correction process and the three adjustment processes may all be performed by observing the single-bit output of the first delay comparator 50 (FIG. 2) on line 52. Except during the gain measurement process described below, the output on line 52 is high "1" when the rising edge of the second delay signal OUT_P precedes the rising edge of the first delay signal OUT_M, which in turn indicates that the sampled voltage V is greater than the threshold of the most relevant preamplifier. As described below in connection with FIG. 14, folding selects the most relevant preamplifier, that is, the preamplifier whose threshold voltage is closest to the sampled voltage V.

Figure 4:
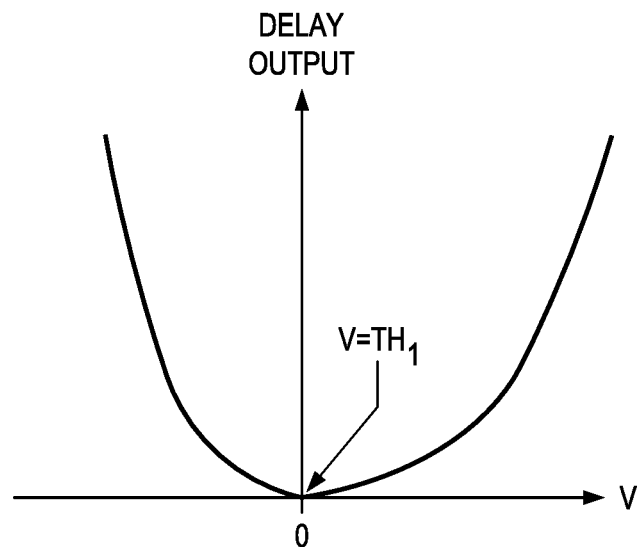
FIG. 4 is a graph of delay output as a function of voltage input for a preamplifier of the analog-to-digital converter system of FIG. 1.

The transfer function (voltage difference to delay) for each one of the preamplifiers 20, 22 and 24 is non-linear. The delay output for a given preamplifier is the difference in timing between the rising edges of its two outputs. In the example graphically represented in FIG. 4, where the first preamplifier 20 is the most relevant preamplifier in the array 16, the delay output of the first preamplifier 20 as a function of the sampled voltage V may be calculated as follows: delay output=$D+g1*V_{diff}+g2*(V_{diff}^2)+g3*(V_{diff}^3)+$, where $V_{diff}=|(V-TH_1)|$, and D, g1, g2, and g3 ... are constants. In the example illustrated in FIG. 4, D may be zero or near zero. The non-linear equation described herein for delay output is a mathematical representation of the non-linear voltage-to-delay pre-amp characteristics represented in FIG. 4. The characteristics cannot be approximated to a linear equation with just D and g1 being non-zero.

Referring again to FIG. 3, each preamplifier in the array 16, under the control of the timing signal CLK, has reset phases R where the preamplifier is reset, and active phases A where the preamplifier provides outputs. The reset phase R begins and ends when the clock signal CLK falls and rises, respectively. The active phase A begins and ends when the clock signal rises and falls, respectively. The relevant delay information is the time difference between the rising edges of the two outputs from the most relevant preamplifier.

A saturation condition (SAT) occurs when the gain of the most relevant preamplifier is so large that the later-arriving rising edge of the output signals from the most relevant preamplifier does not arrive before the end of the active phase A. An example of a saturation condition (SAT) is illustrated in FIG. 3, in region 366, where $V_{DAC}=TH_1+n3$ such that OUT_P precedes OUT_M, and the rising edge of OUT_M does not arrive before the end of the corresponding active phase A. In the illustrated configuration, a saturation condition may be detected by latching the outputs of a preamplifier at the end of an active phase A and checking whether both of the preamplifier's outputs are high ("1"). If either one of the outputs is low ("0") and remains low throughout the active phase A, then there is a saturation condition.

Figure 5:
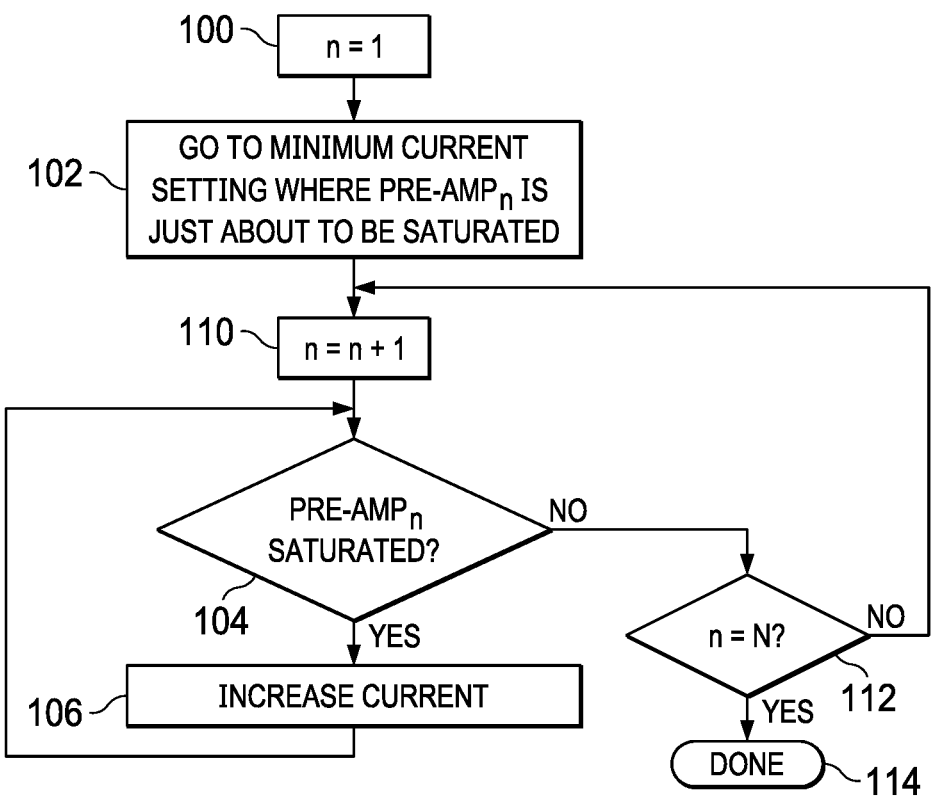
FIGS. 5 and 6 are flowcharts of gain maximizing processes using common-current adjustment for an array of preamplifiers and capacitance adjustment for each of the preamplifiers, respectively.

Two different processes for maximizing gains of individual preamplifiers (Process One) are illustrated in FIGS. 5 and 6. An object of each process is to maximize gain of each preamplifier within the array 16 without creating a saturation condition in any of the preamplifiers. In general, decreasing current through a preamplifier increases the gain of the preamplifier. Thus, in a current-driven process (FIG. 5), the calibration engine/processor 34 causes the current common to all of the preamplifiers 20, 22 and 24 to be set at the lowest value possible without the first preamplifier 20 (n=1; Step 100) being subject to a saturation condition (Step 102).

The saturation check (Step 102) may be performed by decreasing the common current on a step-wise basis until a saturation condition is identified, and then setting the common current at the value that was applied immediately before the saturation condition was identified. The lack of a saturation condition at a particular common current may be determined by confirming that neither output from the most relevant preamplifier is low ("0") throughout a corresponding active phase A across the whole voltage range of the preamplifier. If either of the outputs from the preamplifier is low throughout the active phase A, at any point within the voltage range of the preamplifier, then the preamplifier is subject to a saturation condition at that common current value.

After Step 102, a determination is made as to whether the second preamplifier 22 (n=2, after Step 110) is subject to a saturation condition (Step 104) when the sampled voltage V is in the vicinity of the second threshold voltage $TH_2$. If the second preamplifier 22 is subject to a saturation condition, at any point within the range of the second preamplifier 22, the common current is increased (Step 106) until the second preamplifier 22 is not subject to a saturation condition (by repeating Steps 104 and 106 until the second preamplifier 22 is not subject to a saturation condition).

After each gain-reduction (that is, after each time through Step 106), there is a check for saturation (Step 104), and further reduction of gain (increase in current) (Step 106) if the outcome of the saturation check indicates that it is desirable, before proceeding to the next preamplifier (NO from Step 104, and incrementing value of n by proceeding through Step 112). When gains of all the preamplifiers have been adjusted, that is, when n=N, the process illustrated in FIG. 5 may be concluded (Step 114).

For preamplifiers of the type described herein, delay (gain)=C*V/I, where C is capacitance, I is current, and V is voltage (fixed to VDD). Thus, gain increases as current decreases, and gain increases as capacitance increases. In the illustrated configuration, current I is common across all of the preamplifiers 20, 22 and 24 (FIG. 2). Therefore, if current I is changed, the gains of all of the preamplifiers 20, 22 and 24 are changed. On the other hand, in the illustrated configuration, capacitances of the individual preamplifiers 20, 22 and 24 may be different from each other. If the capacitance of one preamplifier is changed, only the gain of that one preamplifier is thereby changed; the gains of the other preamplifiers are not changed.

Figure 10:
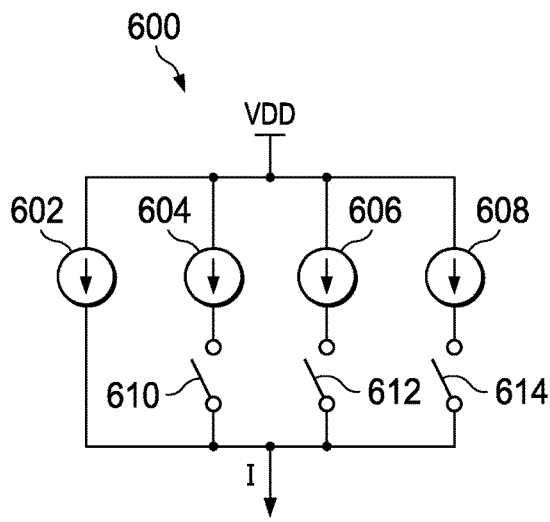
FIG. 10 is a circuit diagram of a variable common-current device for the preamplifier array of the analog-to-digital converter system of FIG. 1.

Various suitable circuits and devices may be used to adjust the common current I. In the illustrated configuration, adjustment of the common current I may be made by a variable current circuit 600 (FIG. 10) which has an array of current sources 602, 604, 606 and 608 in parallel, with all but one of the current sources 602 having its own switch 610, 612 and 614. In a default condition, a first switch 610 may be closed, such that only first and second current sources 602 and 604 are active. To increase the common current I, one or more of the other switches 612 and 614 may be closed, under the control of the calibration engine/ processor 34, to activate the other current sources 606 and 608. To decrease the common current I from the default condition, the first switch 610 may be opened, under the control of the calibration engine/processor 34, to deactivate the second current source 604.

Figure 6:
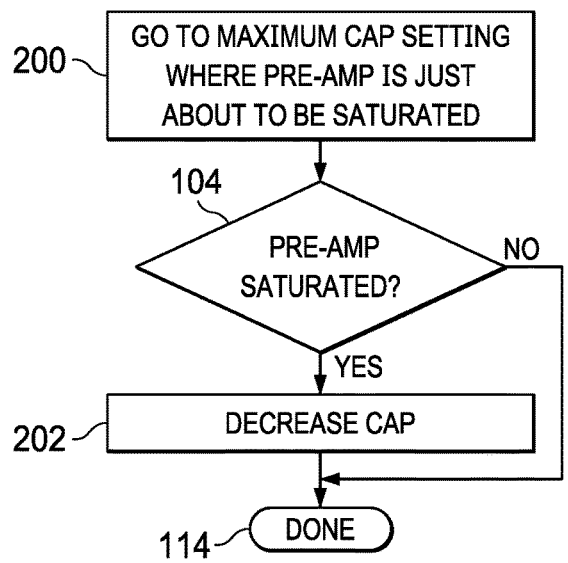

The process illustrated in FIG. 6 is the same as the common-current process illustrated in FIG. 5, except that the FIG. 6 process involves capacitance of individual preamplifiers. In general, increasing capacitance of a preamplifier increases gain of the preamplifier. Thus, instead of causing the current common to all of the preamplifiers 20, 22 and 24 to be set at the lowest value possible without the first preamplifier 20 being subject to a saturation condition (Step 102), the FIG. 6 process causes the capacitance of the first preamplifier 20 to be set at the greatest value possible without the first preamplifier 20 being subject to a saturation condition (Step 200). Setting the capacitance in Step 200 may be done incrementally, with measurements being made using the measurement system illustrated in FIG. 2, until the capacitance is at a value where the preamplifier 20 is just about to be saturated.

Figure 11:
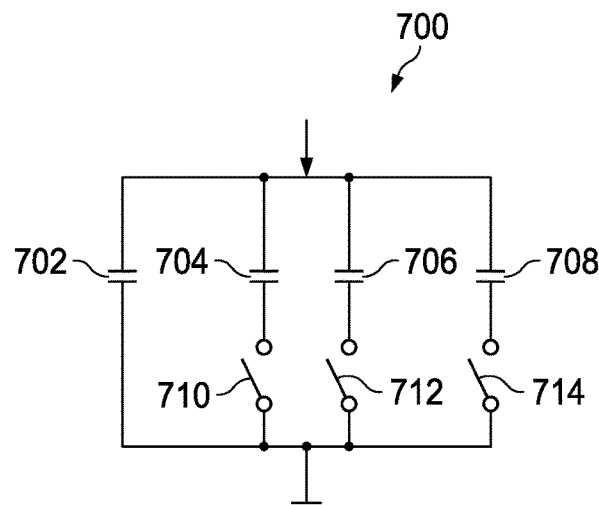
FIG. 11 is a circuit diagram of a variable capacitance device of a preamplifier of the analog-to-digital converter system of FIG. 1.

Various suitable circuits and devices may be used to adjust the capacitance of each one of the preamplifiers 20, 22 and 24. In the illustrated configuration, adjustment of capacitance may be made by a variable capacitance circuit 700 (FIG. 11) which has an array of capacitive elements 702, 704, 706 and 708 in parallel, with all but one of the capacitive elements 702 having its own switch 710, 712 and 714. In a default condition, a first switch 710 may be closed, such that only first and second capacitive elements 702 and 704 are active. To increase the capacitance of the preamplifier which contains the variable capacitance circuit 700, one or more of the other switches 712 and 714 may be closed, under the control of the calibration engine/processor 34, to activate the other capacitive elements 706 and 708. To decrease the capacitance from the default condition, the first switch 710 may be opened, under the control of the calibration engine/processor 34, to deactivate the second element 704. In the illustrated configuration, there is a separate variable capacitance circuit 700 for each one of the preamplifiers 20, 22 and 24.

In the FIG. 6 (capacitance based) process, the saturation check (Step 104) may be performed the same way as in the FIG. 5 (common-current based) process, but instead of increasing the current common to all of the preamplifiers, the FIG. 6 process decreases capacitance of individual preamplifiers that are found to be subject to a saturation condition (Step 202 after Step 104). Within each preamplifier, the negative and positive zones need to be checked for saturation. The flow chart of FIG. 6 only shows steps to be performed for one preamplifier. The FIG. 6 process is repeated for each one of the preamplifiers 20, 22 and 24.

Referring again to FIG. 2, gain of a preamplifier may be measured using two delay multiplexers 250 and 252 and a line 254 carrying a delay-locked loop signal DLL. The first delay multiplexer 250 receives the first delay signal OUT_M and the delay-locked loop signal DLL. The second delay multiplexer 252 receives the second delay signal OUT_P and the delay-locked loop signal DLL. The delay multiplexers 250 and 252 may be controlled by suitable signals from the calibration engine/processor 34. To measure gain of the most relevant preamplifier, the rise times of leading edges of the two delay signals OUT_M and OUT_P are separately measured, relative to the delay-locked loop signal DLL, using the measurement system illustrated in FIG. 2. The further apart the rise times are in time, the greater the gain.

In the measurement system illustrated in FIG. 2, the delay-locked loop signal DLL on line 254 contains a delay generated by a delay-locked loop (not illustrated), with a fine resolution (the resolution may be, for example, about 1 ps). In operation, to measure the timing of the second delay signal OUT_P, the second delay signal OUT_P is transmitted to the delay comparator 50 (via multiplexer 252) while line 254 is connected to the comparator 50 (via multiplexer 250) instead of the first delay signal OUT_M. The delay in line 254 is incrementally increased until the comparator 50 toggles. The delay in line 254 which causes the delay comparator 50 to toggle (on line 52) is a measure of the delay of the second output signal OUT_P.

A similar approach is taken to measure the delay of the first delay signal OUT_M. The first delay signal OUT_M is transmitted to the delay comparator 50 (via multiplexer 250) while line 254 is connected to the comparator 50 (via multiplexer 252), via line 255, instead of the second delay signal OUT_P. The delay in line 254 is incrementally increased until the comparator 50 toggles. In this case, the delay in line 254 at which the delay comparator 50 toggles is a measure of the delay of the first output signal OUT_M. Gain of the preamplifier 20 is then calculated as a function of the two measured delays, as follows: gain=delay out/(V−TH$_1$), where delay_out=|(d$_{outp}$−d$_{outm}$)|, and d$_{outp}$ and d$_{outm}$ are the measured delays of the second and first delay signals OUT_P and OUT_M.

There are also other ways to measure gain within the context of the present disclosure. For example, instead of using the delay-locked loop (DLL) line 254, the known calibration voltage may be set to Vth+X, where X is such that the preamplifier is still the relevant preamplifier. The digital code output by the delay-resolving backend 28 is then itself a representation of the gain of the preamplifier.

Figure 7:
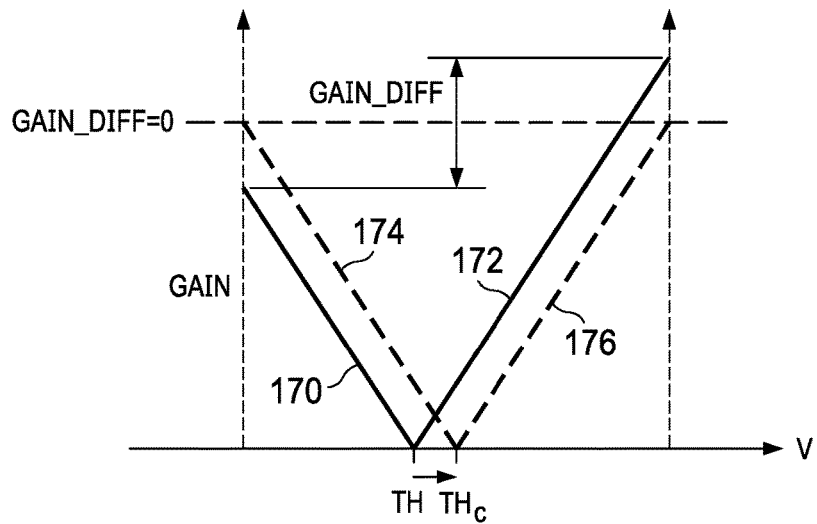
FIG. 7 is a graph of gain as a function of voltage input for a preamplifier of the analog-to-converter system of FIG. 1, showing gain across the range of the preamplifier.

Referring to Process Two, there are two zones for each one of the N preamplifiers 20, 22 and 24 where, if the sampled voltage V is within one of those zones for a preamplifier, that preamplifier is the most relevant preamplifier. For each preamplifier, the sampled voltage V is greater than the threshold voltage in one of the zones, and the sampled voltage is less than the threshold voltage in the other zone. Therefore, the preamplifier array 16 has 2N zones. FIG. 7 schematically represents gain of a preamplifier as a function of the sampled voltage V. In the unequal condition represented by solid lines 170 and 172, gain of the preamplifier while the sampled voltage V is less than the threshold voltage TH is less than gain of the preamplifier while the sampled voltage V is greater than the sampled voltage V.

By shifting the threshold voltage TH to another value TH$_C$, the relationship between the gain of the preamplifier and the voltage V can be shifted, in both zones of the preamplifier, as represented by dotted lines 174 and 176, such that gain at the opposite ends of the voltage range of the preamplifier is the same (that is, Gain_Diff=0). To achieve such normalization of gain within the two zones of a preamplifier, it is desirable to employ fine gain control which may be achieved by adjusting bulk (body) voltage. Such bulk voltage adjustment may include shifting the threshold voltage of the preamplifier by applying an offset voltage to the threshold voltage. Adjusting the bulk voltage may provide finer gain control than adjusting the capacitance of the preamplifier.

Figure 8:
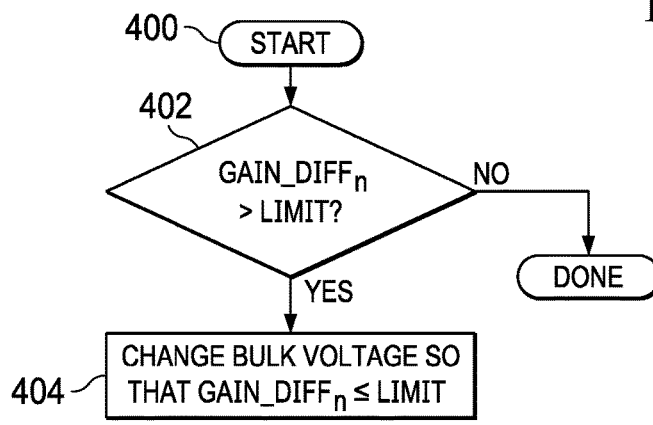
FIG. 8 is a flowchart of a gain normalization process for individual preamplifiers of the analog-to-digital converter system of FIG. 1.

A gain normalization process is illustrated in FIG. 8. The illustrated process includes the steps performed for one preamplifier. The process is repeated for each one of the other preamplifiers. Thus, starting with the first preamplifier 20 (Step 400), gains are measured for both zones of the preamplifier 20, using the measurement system illustrated in FIG. 2. If the difference between the two gains Gain_Diff is greater than a predetermined limit (that is, too large) (Yes from Step 402), then the bulk voltage for the preamplifier 20 is changed so that the gain difference for the preamplifier 20 is less than or equal to the predetermined limit (Step 404). Changing the bulk voltage may be done incrementally, with measurements being made using the measurement system illustrated in FIG. 2, until the gain difference for the preamplifier 20 is less than or equal to the predetermined limit. The bulk voltage may be changed by, for example, changing the threshold voltage of the preamplifier. The process is then repeated for each one of the other preamplifiers 22 and 24. As used herein, the term "bulk voltage" is synonymous with "back-gate voltage."

Figure 9:
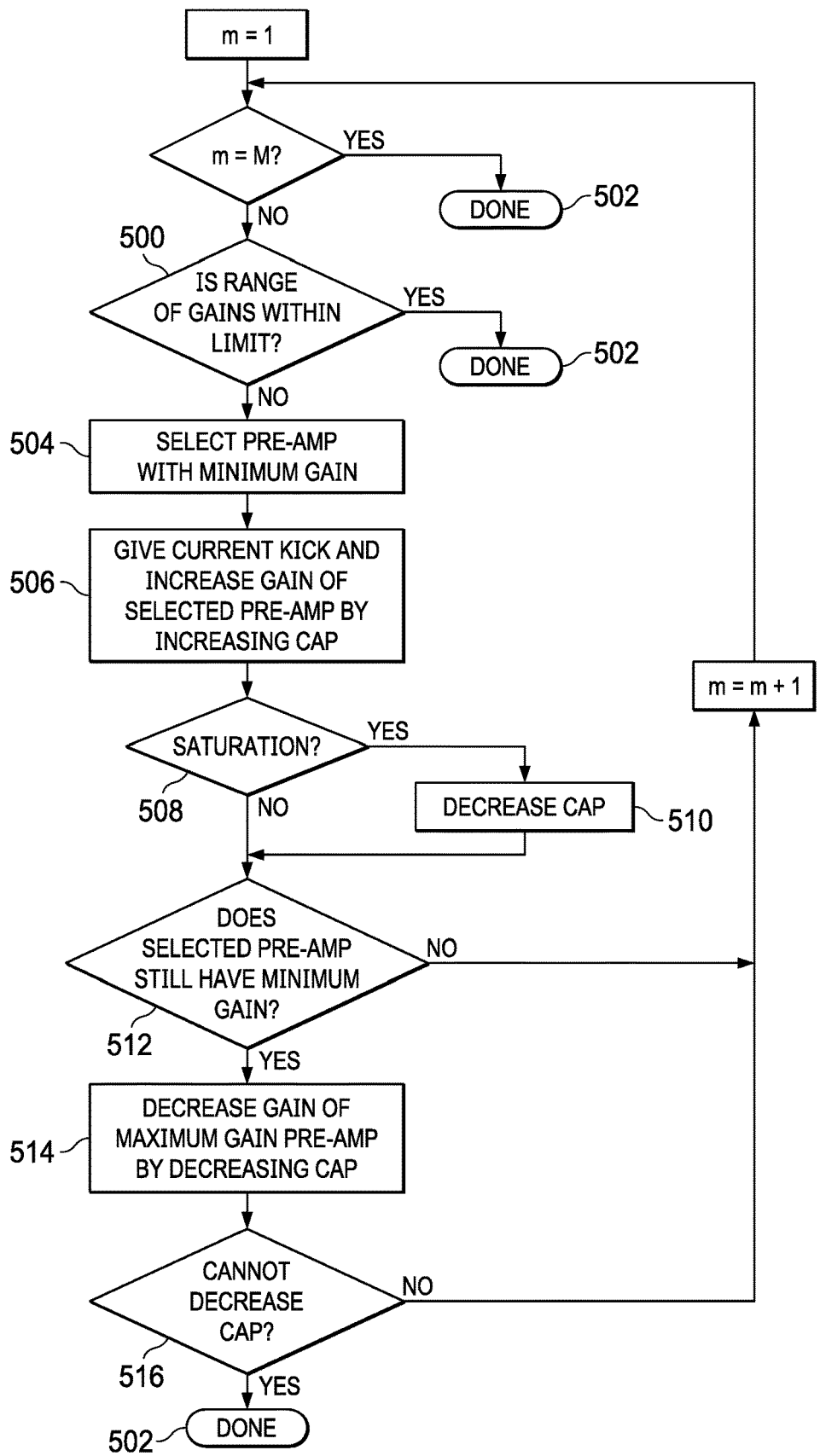
FIG. 9 is a flow-chart of a process for normalizing gain across a preamplifier array of the analog-to-digital converter system of FIG. 1.

FIG. 9 illustrates an iterative, algorithmic approach to normalizing gain across the preamplifier array 16 (Process Three). The approach may be used, if desired, to maximize performance of the analog-to-digital converter system 10 by identifying the preamplifier which has the minimum gain, and then increasing the gain of that preamplifier, if possible considering other constraints. One such constraint is avoiding a saturation condition.

In operation, the gains of all of the preamplifiers within the array 16 may be determined using the measuring system illustrated in FIG. 2, such that the preamplifier within the array 16 which has the least gain and the preamplifier within the array which has the most gain may be identified. The gain-normalization process may then begin by determining whether the difference between the highest and lowest gains is within a predetermined limit (Step 500). If the difference is within the predetermined limit (Yes from Step 500), then the gain range of the preamplifier array is acceptable, and the process is completed (Step 502). If the gain range is not acceptable (NO from Step 500), then the preamplifier which has the minimum gain is selected (Step 504), and a current kick is given to the selected preamplifier and the capacitance of the preamplifier is increased to increase its gain (Step 506).

Figure 12:
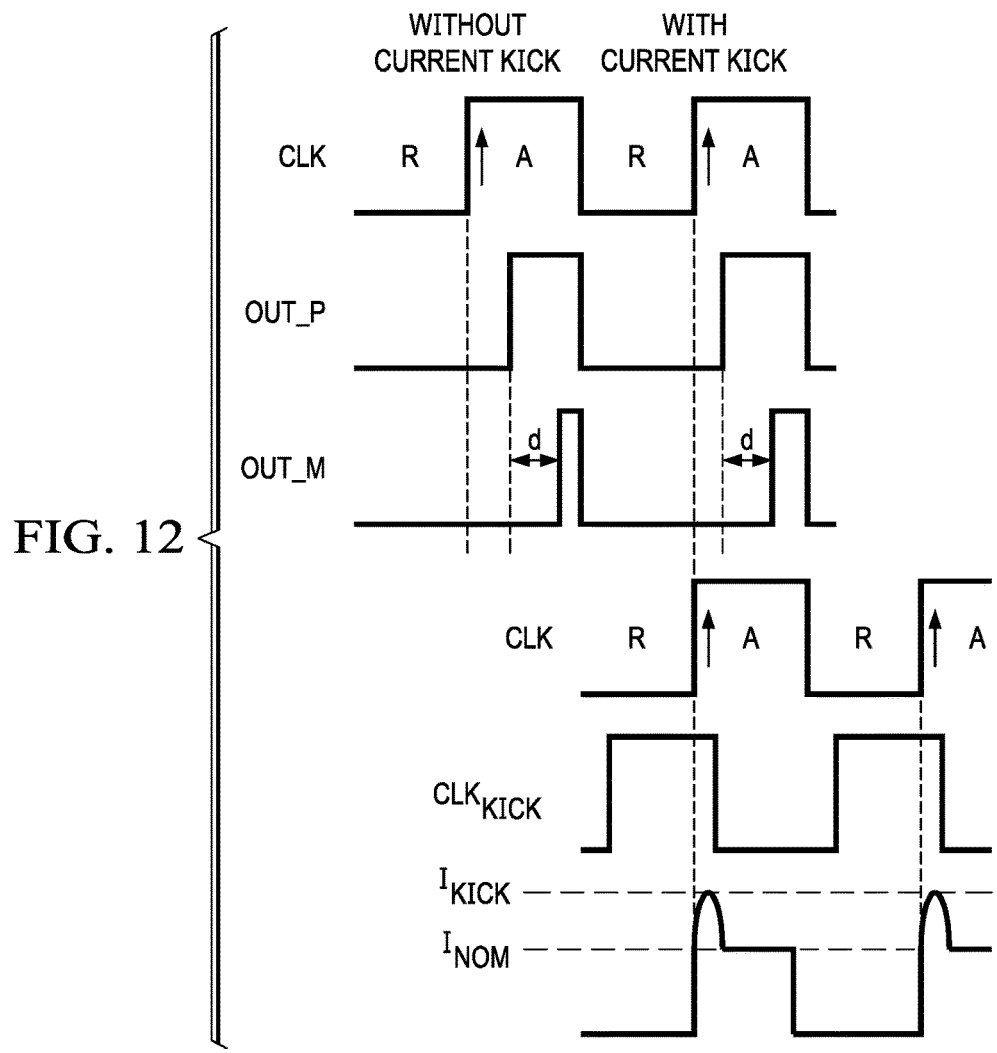
FIG. 12 is a timing diagram for a current kick process.

Applying a current-kick improves the response time of a preamplifier by taking the preamplifier away from saturation. If the preamplifier without any current kick is close to saturation, then any further increase in capacitance (gain) causes saturation. Since the current kick brings the preamplifier away from saturation, the capacitance (gain) of the preamplifier can be increased without creating a saturation condition. Current kick by itself does not change the gain of the preamplifier. As illustrated in FIG. 12, the timing difference, d, between the leading edge of the first delay signal OUT_M and the second delay signal OUT_P is the same both without current kick and with current kick. However, current kick enables an increase in gain by bringing the preamplifier away from saturation (that is, by advancing (by moving leftward in FIG. 12) the leading edges of the first and second delay signals OUT_M, OUT_P within each active phase A). Hence, current kick allows a higher capacitance setting before the preamplifier saturates. The timing of a clock signal CLK$_{KICK}$ for applying the current kick to the preamplifiers 20, 22 and 24 is controlled by the calibration engine/processor 34. The current-kick clock signal CLK$_{KICK}$ is timed to increase the common current I during an initial portion of each active phase A. The common current I is the current that is applied to all of the preamplifiers. The common current I has a nominal value I$_{NOM}$ during the portion of the active phase A when the clock signal CLK is high and the current-kick clock signal CLK$_{KICK}$ is low. The common current I has a current-kick value I$_{KICK}$ ($I_{KICK} > I_{NOM}$) during the portion of the active phase A when both the clock signal CLK and the current-kick clock signal $CLK_{KICK}$ are high.

If the current kick and the increase in capacitance create a saturation condition within the selected preamplifier (YES from Step 508), then gain of the selected amplifier is decreased by decreasing its capacitance (Step 510).

Then, if the selected preamplifier does not still have the minimum gain, the process returns to Step 500 (NO from Step 512). But if the selected preamplifier still has the least gain within the preamplifier array (YES from Step 512), then gain of the preamplifier which has the greatest gain in the array 16 is decreased by decreasing its capacitance (Step 514), and the process is returned to Step 500, unless the capacitance cannot be decreased without creating a saturation condition (YES from Step 516) in which case the process is ended (Step 502).

According to the present disclosure, it may be the case that, even after a current kick is applied and gain for a selected preamplifier is maximized by increasing its capacitance (Step 506), the selected preamplifier still has the least gain after sorting of all of the preamplifiers within the array 16. Where that is the case (YES from Step 512), the preamplifier having the maximum gain is selected and its gain is reduced by reducing its capacitance setting (Step 514), if possible without creating a saturation condition. After every change of gain (Steps 506, 514), a saturation check is done to ensure there is no saturation condition (Steps 508 and 516).

The process illustrated in FIG. 9 may end (Step 502) when all of the preamplifier gains are within a limit (YES from Step 500), gain of the minimum-gain preamplifier cannot be increased and gain of the maximum-gain preamplifier cannot be decreased (Yes from Step 516), or after a programmable number of iterations (in the illustrated example, when m=M). Gain should not be increased if doing so would cause a preamplifier to become saturated. As described above, a saturation check may be performed by confirming that the later-arriving edge of the delay signals OUT_M and OUT_P rises within the active region A across the range of the preamplifier under consideration.

Figure 13:
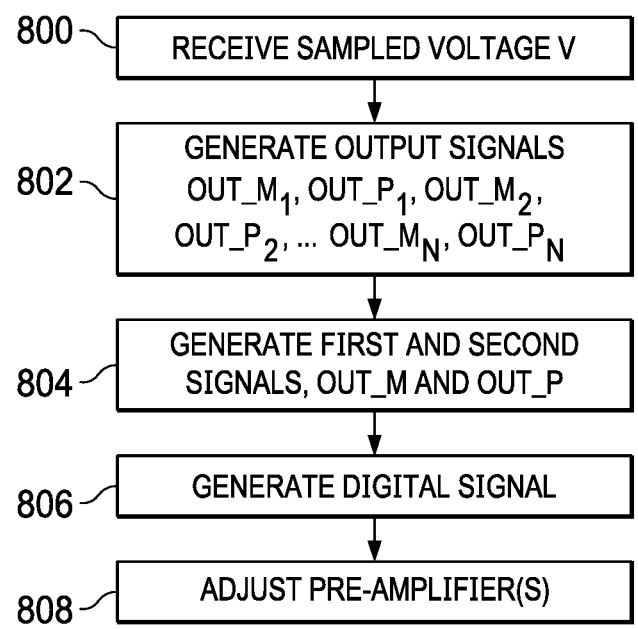
FIG. 13 is a flow-chart of a method of using, or operating, the analog-to-digital converter system of FIG. 1.

A method of using, or operating, an analog-to-digital converting system is illustrated in FIG. 13. The method includes receiving a sampled voltage V corresponding to one of an input voltage VIN and a known voltage $V_{DAC}$ (Step 800). As explained above, the input voltage VIN is selected by the multiplexer 12 during an operational phase, while the known voltage $V_{DAC}$ is selected by the multiplexer 12 during a calibration phase, under the control of a select signal SEL1. Further, the method illustrated in FIG. 13 also includes causing N preamplifiers 20, 22 and 24 to generate output signals $OUT\_M_1$, $OUT\_P_1$, $OUT\_M_2$, $OUT\_P_2$, $OUT\_M_N$ and $OUT\_P_N$ based on the sampled voltage V (Step 802), and generating first and second signals OUT_M and OUT_P based on the output signals $OUT\_M_1$, $OUT\_P_1$, $OUT\_M_2$, $OUT\_P_2$, $OUT\_M_N$ and $OUT\_P_N$ (Step 804). In the configuration illustrated in FIG. 14, a folding delay multiplexer 26 causes the relative timings of the first and second signals OUT_M and OUT_P to correspond to the relative timings of the output signals of the most relevant one of the preamplifiers.

Referring to FIG. 13, the illustrated method includes causing a delay-resolving analog-to-digital backend 28 to generate a single-bit digital signal (on line 52) representing an order of receipt of the first and second signals OUT_M and OUT_P (Step 806), and adjusting one or more of the preamplifiers 20, 22 and 24 based on the single-bit digital signal (on line 52) (Step 808). According to one aspect of the present disclosure, the gains and ranges of the preamplifiers 20, 22 and 24 may be adjusted, and preferably matched across the preamplifier array 16. After the preamplifiers 20, 22 and 24 have been calibrated, the preamplifiers 20, 22 and 24 may be adjusted for maximum, or improved, gain, and then corrected for gain mismatch across the array 16, all while avoiding a saturation condition.

As illustrated in FIG. 14, by way of example, the preamplifier array 16 may have first, second, third, and fourth preamplifiers 20, 22, 1056 and 24 (N=4; $TH_2 < TH_3 < TH_N$) which generate respective output signals $OUT\_P_1$, $OUT\_M_1$, $OUT\_P_2$, $OUT\_M_2$, $OUT\_P_3$, $OUT\_M_3$, $OUT\_P_N$ and $OUT\_M_N$ having different timings, and thereby develop delay information representative of the sampled voltage V. The output signals $OUT\_P_1$, $OUT\_M_1$, $OUT\_P_2$, $OUT\_M_2$, $OUT\_P_3$, $OUT\_M_3$, $OUT\_P_N$ and $OUT\_M_N$ are transmitted on respective conductive lines 1102, 1110, 1104, 1112, 1106, 1114, 1108 and 1116.

In operation, the delay information developed by the preamplifiers 20, 22, 1056 and 24 is processed by first, second, third, fourth and fifth OR gates 1138, 1140, 1142, 1144 and 1146 and first, second, third, fourth and fifth AND gates 1148, 1150, 1152, 1154 and 1156. The processing causes signals generated by the preamplifiers to be folded into a single pair of signals which contain all of the information of interest. If desired, the folding circuit illustrated in FIG. 14 may be constructed and operated as shown and described in U.S. Pat. No. 10,673,456. In the configuration illustrated in FIG. 14, the OR gates 1138, 1140, 1142, 1144 and 1146 and the AND gates 1148, 1150, 1152, 1154 and 1156 are elements of the folding delay multiplexer 26, and are employed within the folding delay multiplexer 26 in the operational phase. The first one of the first output lines 1102 is connected to inputs of the first OR and AND gates 1138 and 1148, and the first one of the second output lines 1110 is connected to inputs of the first OR and AND gates 1138 and 1148. In like manner, the first and second output lines 1104, 1106, 1108, 1112, 1114 and 1116 of the other preamplifiers 20, 22 and 1056 are connected to inputs of the respective second, third and fourth OR and AND gates 1140, 1142, 1144, 1150, 1152 and 1154.

Output signals generated by the first through fourth OR gates 1138, 1140, 1142 and 1144 (on conductive lines 1158, 1160, 1162 and 1164) are input to the fifth AND gate 1156, and output signals generated by the first through fourth AND gates 1148, 1150, 1152 and 1154 (on conductive lines 1180, 1182, 1184 and 1186) are input to the fifth OR gate 1146. In each case, the timing of the output signals generated by the OR gates 1138, 1140, 1142, 1144 and 1146 corresponds to the timing of the first signal to arrive at the respective inputs of the OR gates 1138, 1140, 1142, 1144 and 1146, whereas the timing of the output signals generated by the AND gates 1148, 1150, 1152, 1154 and 1156 corresponds to the timing of the last signal to arrive at the respective inputs of the AND gates 1148, 1150, 1152, 1154 and 1156.

In operation, the preamplifier array 16 generates preamplifier outputs with early and late rising edges. When the system 10 is in the calibration phase, the folding delay multiplexer 26 transmits timing signals directly from a desired preamplifier to lines 1044 and 1190, under the control of select signal $SEL_2$ (FIG. 2). When the system 10 is in the operational mode, the first through fourth OR gates 1138, 1140, 1142 and 1144 select the signals which reach them first (earlier), and generate signals on lines 1158, 1160, 1162 and 1164 with timings which correspond to the selected (earlier-arriving) signals. Meanwhile, the first through fourth AND gates 1148, 1150, 1152 and 1154 select the signals which reach them last (later), and generate signals on lines 1180, 1182, 1184 and 1186 with timings which correspond to the selected (later-arriving) signals.

In the operational phase, the fifth AND gate 1156 generates a signal (OUT_P) on conductive line 1044 which preserves the timing of the latest-arriving of the earlier-arriving signals, and the fifth OR gate 1146 generates a signal (OUT_M) on a conductive line 1190 which preserves the timing of the earliest-arriving of the later signals. A method of operating the folding circuit illustrated in FIG. 14 is described in U.S. Pat. No. 10,673,456. Other folding circuits that may be employed in the system 10, and methods of operating such circuits are also described in U.S. Pat. No. 10,673,456.

Figure 15:
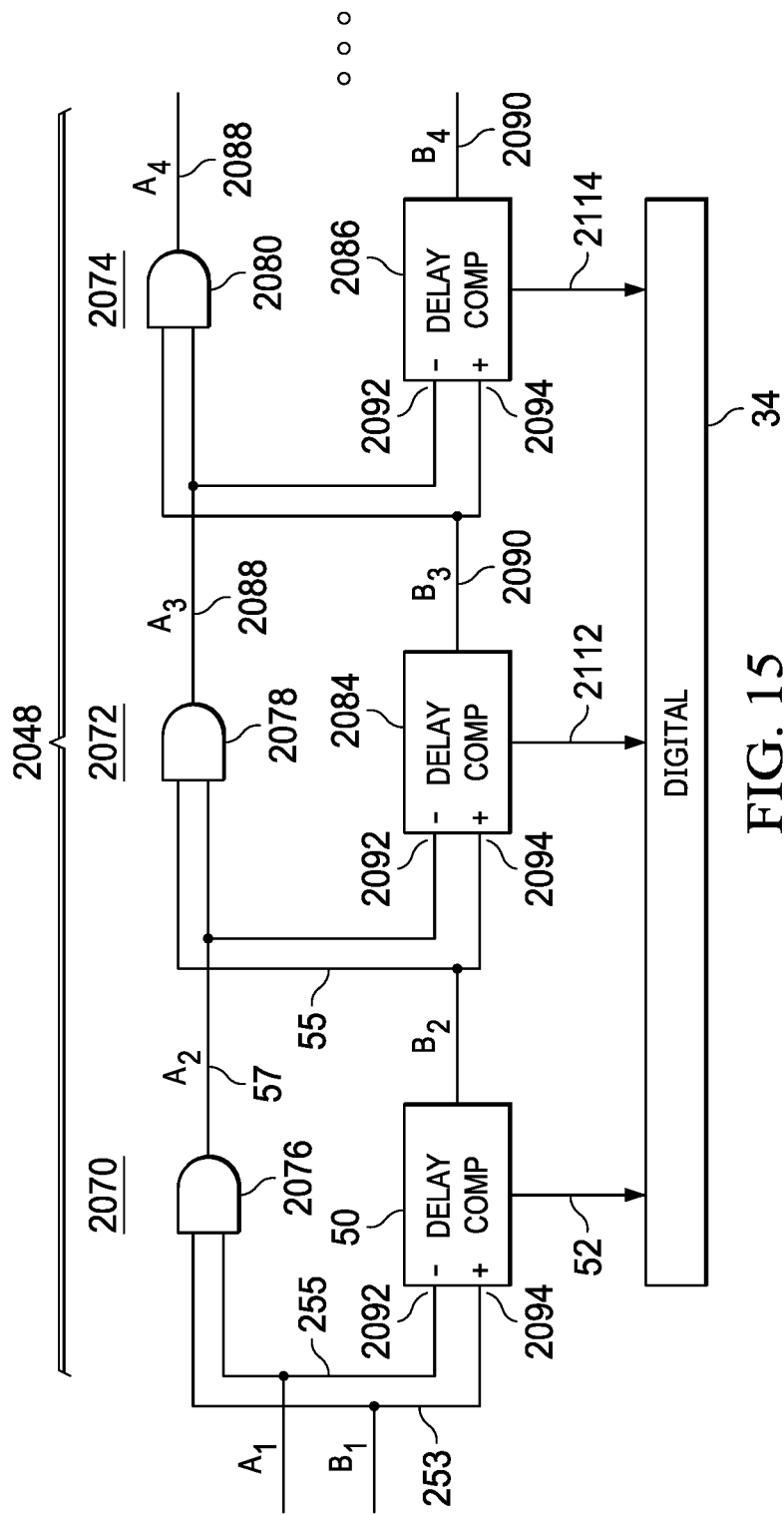
FIG. 15 is a block diagram of a back-end delay-to-digital converter for the analog-to-digital converter of FIG. 1.

FIG. 15 illustrates a backend delay-to-digital converter 2048 for the system 10. In the illustrated configuration, the delay-to-digital converter has three or more stages 2070, 2072 and 2074, with respective AND gates 2076, 2078 and 2080 and delay comparators 50, 2084 and 2086. Please note that the illustrated AND gates are merely examples of logic gates that may be employed according to this disclosure. If desired, this disclosure may be implemented with or without AND gates and/or with or without gates other than AND gates.

In the illustrated configuration, the second and third AND gates 2078 and 2080 are essentially identical to the first AND gate 2076, and the second and third delay comparators 2084 and 2086 are essentially identical to the first delay comparator 50. The conductive output lines 255 and 253 are both coupled to inputs of the first AND gate 2076. A first one of the conductive lines 255 is also coupled to a first input 2092 of the first delay comparator 50, and the second one of the conductive lines 253 is coupled to a threshold input 2094 of the first delay comparator 50.

An output line 57 from the first AND gate 2076 is electrically coupled to one of the inputs of the second AND gate 2078, and to the first input 2092 of the second delay comparator 2084. A conductive line 55 from the first delay comparator 50 is electrically coupled to the other one of the inputs of the second AND gate 2078, and to the threshold input 2094 of the second delay comparator 2084. In like manner, an output line 2088 from the second AND gate 2078 is electrically coupled to one of the inputs of the third AND gate 2080, and to the first input 2092 of the third delay comparator 2086, and a conductive line 2090 from the second delay comparator 2084 is electrically coupled to the other one of the inputs of the third AND gate 2080, and to the threshold input 2094 of the third delay comparator 2086.

The pattern created by the second and third stages 2072 and 2074 may be continued, if desired, for a fourth stage or for as many additional stages as desired. Each successive stage has an AND gate and a delay comparator essentially identical to the AND gates 2078 and 2080 and the delay comparators 2084 and 2086 of the second and third stages 2072 and 2074, and electrically coupled to the AND gate and delay comparator of a preceding stage in the same way that the third AND gate 2080 and the third delay comparator 2086 are electrically coupled to the second AND gate 2078 and the second delay comparator 2084.

In operation, signals $A_N$ and $B_N$ (where N=1, 2, 3 . . . for the first, second, third . . . stages 2070, 2072, 2074 . . . respectively) are applied to respective ones of the AND gates 2076, 2078 and 2080, causing the AND gates 2076, 2078 and 2080 to generate corresponding signals $A_{N+1}$. For each one of the AND gates 2076, 2078 and 2080, the timing of the leading edge of signal $A_{N+1}$ tracks the timing of the leading edge of the later-arriving of signals $A_N$ and $B_N$.

Figure 19:
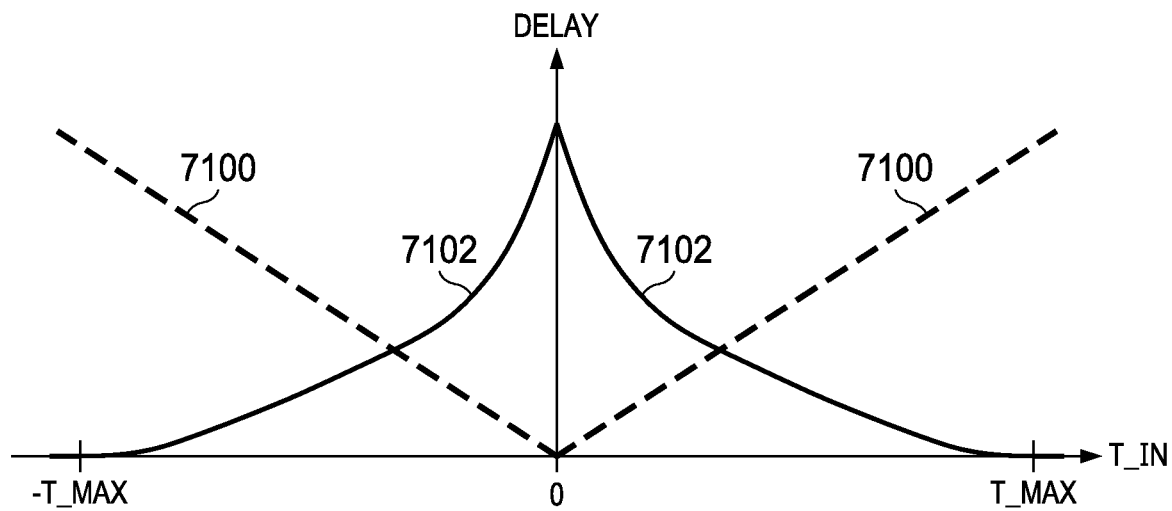
FIG. 19 is a graph which illustrates AND-gate delay and comparator delay generated by an AND gate and a delay comparator, respectively, of the analog-to-digital converter system of FIG. 1, where the AND-gate delay and the comparator delay are functions of input-signal delay.

In particular, for each one of the AND gates 2076, 2078 and 2080, the timing of the leading edge of signal $A_{N+1}$ is equal to the timing of the leading edge of the earlier-arriving of signals $A_N$ and $B_N$ plus an amount of time (7100, FIG. 19) that is related to the extent to which the leading edge of the later-arriving of signals $A_N$ and $B_N$ lags behind the leading edge of the earlier-arriving of signals $A_N$ and $B_N$. In operation, the input signal delay T_IN for a given stage N is the extent to which signal $A_N$ lags behind signal $B_N$. The delay 7100 caused by the respective AND gate (that is, the extent to which the leading edge of the respective signal $A_{N+1}$ lags behind the leading edge of the earlier-arriving of the corresponding signals $A_N$ and $B_N$) is linearly related to the absolute value of the input signal delay T_IN.

Meanwhile, signals $A_N$ and $B_N$ are also applied to the first inputs 2092 and threshold inputs 2094, respectively, of the delay comparators 50, 2084 and 2086, causing the delay comparators 50, 2084 and 2086 to generate corresponding signals $B_N$-pi. For each one of the delay comparators 50, 2084 and 2086, the timing of the leading edge of signal $B_{N+1}$ tracks the timing of the leading edge of the earlier-arriving of signals $A_N$ and $B_N$. In particular, for each one of the delay comparators 50, 2084 and 2086, the timing of the leading edge of signal $B_{N+1}$ is equal to (1) the timing of the leading edge of the earlier-arriving of signals $A_N$ and $B_N$ plus (2) a delay 7102 (FIG. 19) that is logarithmically inversely related to the absolute value of the input signal delay T_IN.

Figure 20:
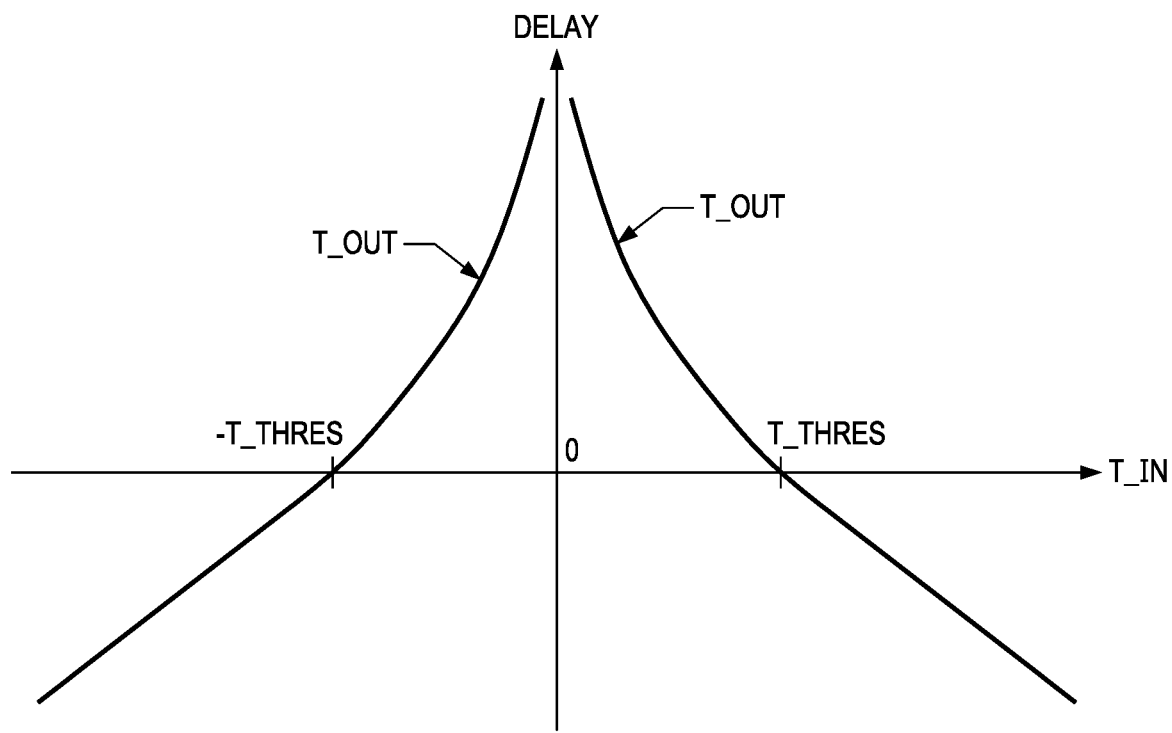
FIG. 20 is a graph which illustrates output-signal delay as a function of the input-signal delay of FIG. 19.

Subtracting the delay 7100 generated by the AND gate from the delay 7102 generated by the comparator yields the output signal delay T_OUT (FIG. 20) for any given stage. When the absolute value of the input signal delay T_IN is less than a threshold delay T_THRES, then the output signal delay T_OUT is a positive value (meaning that the leading edge of signal $B_{N+1}$ generated by the respective delay comparator 50, 2084 and 2086 precedes the leading edge of signal $A_{N+1}$ generated by the respective AND gate 2076, 2078 and 2080). On the other hand, when the absolute value of the input signal delay T_IN is greater than the threshold delay T_THRES, then the output signal delay T_OUT is a negative value (meaning that the leading edge of signal $B_{N+1}$ lags behind the leading edge of corresponding signal $A_{N+1}$).

In operation, the first delay comparator 50 issues a first sign signal ("1" or "0") on a first digital line 52 to the calibration engine/processor. The first sign signal is based on which one of the leading edges of the signals $A_1$ and $B_1$ is first received by the first delay comparator 50, such that the first sign signal reflects the order of the leading edges of signals $A_1$ and $B_1$ applied to the first and threshold inputs 2092 and 2094 of the first delay comparator 50. Then, the first AND gate 2076 and the first delay comparator 50 generate signals $A_2$ and $B_2$ which are applied to the AND gate 2078 and the delay comparator 2084 of the second stage 2072. The second delay comparator 2084 issues a second sign signal ("1" or "0") on a second digital line 2112 to the calibration engine/processor 34. The second sign signal is based on which one of the leading edges of the signals $A_2$ and $B_2$ is first received by the second delay comparator 2084, such that the second sign signal reflects the order of the leading edges of the signals $A_2$ and $B_2$ applied to the inputs 2092 and 2094 of the second delay comparator 2084.

Then, the second AND gate 2078 and the second delay comparator 2084 generate signals $A_3$ and $B_3$ which are applied to the AND gate 2080 and the delay comparator 2086 of the third stage 2074. The third delay comparator 2086 issues a third sign signal ("1" or "0") on a third digital line 2114 to the calibration engine/processor 34. The third sign signal is based on which one of the leading edges of the signals $A_3$ and $B_3$ is first received by the third delay comparator 2086, such that the third sign signal reflects the order of the leading edges of the signals $A_3$ and $B_3$ applied to the inputs 2092 and 2094 of the third delay comparator 2086. The pattern may be continued for a fourth stage or for more than four stages, as desired.

Since the delay between signals $A_1$ and $B_1$ can be predicted as a function of the voltage V, and vice versa, and since the delay between the signals $A_{N+1}$ and $B_{N+1}$ output to a successive stage can be predicted as a function of the signals $A_N$ and $B_N$ received by the preceding stage, and vice versa, the sign signals output on lines 52, 2112 and 2114 by the delay comparators 50, 2084 and 2086 of the cascade of stages 2070, 2072 and 2074 can be predicted as a function of the voltage V, and vice versa. Therefore, during the operation mode, a code made up of the sign signals may be reliably compared to a predetermined correlation to determine an approximation of the input voltage VIN.

Figure 16:
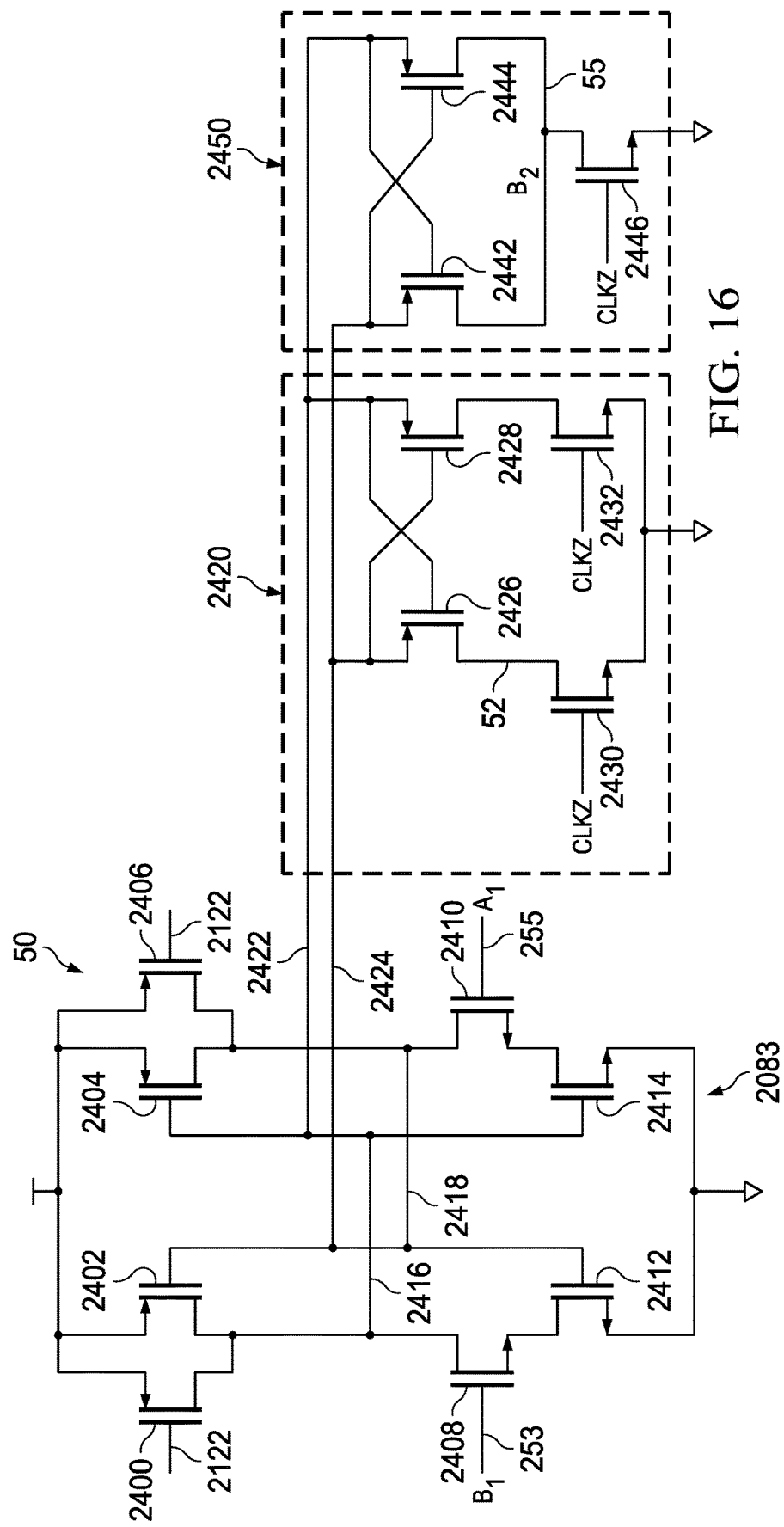
FIG. 16 is a circuit diagram of an example of a comparator circuit merged with sign-out and delay-out circuits for the analog-to-digital converter system of FIG. 1.

Referring now to FIG. 16, the delay comparator 50 has a comparator circuit 2083 which has first, second, third, fourth, fifth, sixth, seventh and eighth transistors 2400, 2402, 2404, 2406, 2408, 2410, 2412 and 2414. The timing of the delay comparator 50 is controlled by a signal from a clock applied to the gates of the first and fourth transistors 2400 and 2406, on a conductive line 2122. The first and second signals $A_1$ and $B_1$ on lines 255 and 253 are applied to the gates of the sixth and fifth transistors 2410 and 2408, respectively. The drains of the first, second and fifth transistors 2400, 2402 and 2408 are electrically connected to each other, and to the gates of the third and eighth transistors 2404 and 2414, via a first conductive line 2416. The drains of the third, fourth and sixth transistors 2404, 2406 and 2410 are likewise electrically connected to each other, and to the gates of the second and seventh transistors 2402 and 2412, via a second conductive line 2418.

The first and second conductive lines 2416 and 2418 of the comparator circuit 2083 are electrically connected to a sign-out circuit 2420 via respective third and fourth conductive lines 2422 and 2424. As illustrated in FIG. 16, the sign-out circuit 2420 is merged with the comparator circuit 2083. The sign-out circuit 2420 has first, second, third, and fourth transistors 2426, 2428, 2430 and 2432. The third conductive line 2422 is electrically connected to the gate and the source of the first and second transistors 2426 and 2428 of the sign-out circuit 2420, respectively, while the fourth conductive line 2424 is electrically connected to the source and the gate of the first and second transistors 2426 and 2428 of the sign-out circuit 2420, respectively.

In operation, when the delay comparator 50 is enabled by the clock signal on line 2122, a sign signal is generated within the sign-out circuit 2420 on line 52. The sign signal is forwarded to the calibration engine/processor 34 on line 52, and represents the order in which the output signals $A_1$ and $B_1$ arrive at the first and threshold inputs 2092 and 2094 (FIG. 15) of the delay comparator 50. The operation of the sign-out circuit 2420 is controlled by an inverted clock signal CLKZ applied to the gates of the third and fourth transistors 2430 and 2432 of the sign-out circuit 2420. The inverted clock signal CLKZ is an inverted version of the clock signal that is applied to the gates of the first and fourth transistors 2400 and 2406 of the comparator circuit 2083 on line 2122.

The third and fourth conductive lines 2422 and 2424 are also electrically connected to a delay-out circuit 2450. As illustrated in FIG. 16, the delay-out circuit 2450 is merged with the comparator circuit 2083. The delay-out circuit 2450 has first, second and third transistors 2442, 2444 and 2446. The third conductive line 2422 is electrically connected to the gate and the source of the first and second transistors 2442 and 2444 of the delay-out circuit 2450, respectively, while the fourth conductive line 2424 is electrically connected to the source and the gate of the first and second transistors 2442 and 2444 of the delay-out circuit 2450, respectively.

In operation, a delay signal $B_2$ is generated on line 55, which is electrically connected to the drains of both of the first and second transistors 2442 and 2444 of the delay-out circuit 2450. The timing of the leading edge of the delay signal $B_2$ on line 55 relative to the timing of the earlier-arriving of the leading edges of the signals $A_1$ and $B_1$ on inputs 255 and 253 is the comparator delay. The operation of the delay-out circuit 2450 is controlled by the same inverted clock signal CLKZ that is applied to the third and fourth transistors 2430 and 2432 of the sign-out circuit 2420. The inverted clock signal CLKZ is applied to the gate of the third transistor 2446 of the delay-out circuit 2450. The drain of the third transistor 2446 of the delay-out circuit 2450 is electrically connected to the drains of the first and second transistors 2442 and 2444 of the delay-out circuit 2450.

Figure 17:
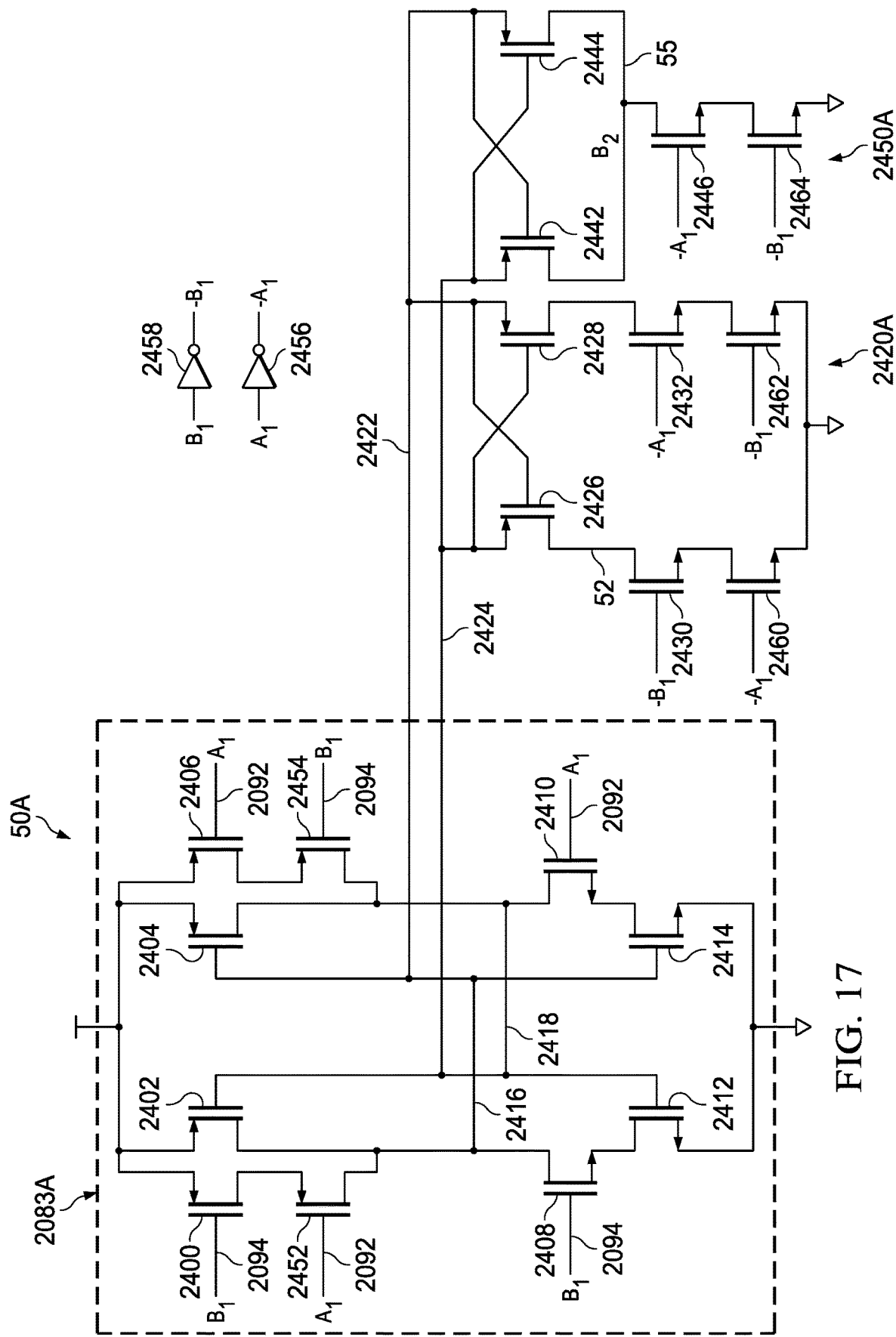
FIGS. 17 and 18 are circuit diagrams of other examples of comparator circuits merged with sign-out and delay-out circuits.

A clock-less delay comparator 50A is illustrated in FIG. 17. If desired, the clock-less delay comparator 50A may be used in the system 10 in place of the delay comparator 50 illustrated in FIG. 16. The clock-less delay comparator 50A is similar to the delay comparator 50 illustrated in FIG. 16 except that (1) the clock-less delay comparator 50A has a comparator circuit 2083A which uses the later-arriving of the signals $A_1$, $B_1$, applied to the first and threshold inputs 2092 and 2094, instead of the clock signal, and (2) inverted signals $-A_1$ and $-B_1$ are used to control the operation of a sign-out circuit 2420A and a delay-out circuit 2450A.

As illustrated in FIG. 17, the comparator circuit 2083A has first and second extra transistors 2452 and 2454. The first input signal $A_1$ is applied, on the first input line 2092, to the gates of the fourth and first-extra transistors 2406 and 2452, and the second input signal $B_1$ is applied, on the threshold input line 2094, to the first and second-extra transistors 2400 and 2454. The first and first-extra transistors 2400 and 2452 are electrically connected to each other in series, and the fourth and second-extra transistors 2406 and 2454 are electrically connected to each other in series. Thus, the clock-less delay comparator 50A is enabled by the arrival of the later-arriving of the two input signals $A_1$ and $B_1$.

At the same time, the first and second input signals $A_1$ and $B_2$ are applied to respective inverter gates 2456 and 2458, which generate respective inverted signals $-A_1$, $-B_1$. The logic levels of the inverted signals $-A_1$, $-B_1$ are the opposite of those of the respective input signals $A_1$, $B_1$. In operation, when the clock-less delay comparator 2083A is enabled, a sign signal is generated within the sign-out circuit 2420A, on line 52. As illustrated in FIG. 17, the sign-out circuit 2420A is merged with the comparator circuit 2083A. Similar to the operation of the delay comparator 50 illustrated in FIG. 16, the sign signal in the FIG. 17 configuration is forwarded to the calibration engine/processor 34 on line 52, and represents the order in which the output signals $A_1$, $B_1$ arrive at the first and threshold inputs 2092 and 2094 of the clock-less delay comparator 50A.

The inverted signals $-A_1$ and $-B_1$ are applied to the third and fourth transistors 2430 and 2432 of the sign out circuit 2420A, and to two extra transistors 2460 and 2462. In the illustrated configuration, the first inverted signal $-A_1$ is applied to the fourth and first-extra transistors 2432 and 2460 of the sign-out circuit 2420A, and the third and first-extra transistors 2430 and 2460 of the sign-out circuit 2420A are electrically connected to each other in series. The second inverted signal $-B_1$ is applied to the third and second-extra transistors 2430 and 2462 of the sign-out circuit 2420A, and the fourth and second-extra transistors 2432 and 2462 of the sign-out circuit 2420A are electrically connected to each other in series. Thus, the operation of the sign-out circuit 2420A is controlled by both of the inverted signals $-A_1$ and $-B_1$.

As illustrated in FIG. 17, the first and second conductive lines 2416 and 2418 of the comparator circuit 2083A are also electrically connected to a delay-out circuit 2450A, via the third and fourth conductive lines 2422 and 2424. The delay-out circuit 2450A is merged within the clock-less delay comparator 50A. The delay-out circuit 2450A has an extra transistor 2464. In operation, when the clock-less delay comparator 50A is enabled, a delay signal $B_2$ is generated on line 55. The timing of the leading edge of the delay signal $B_2$ on line 55 relative to the timing of the earlier-arriving of the leading edges of the signals $A_1$ and $B_1$ on inputs 2092 and 2094 is the comparator delay. The timing of the delay-out circuit 2450A is controlled by both of the inverted signals $-A_1$ and $-B_1$, which are applied to the third transistor 2446 and the extra transistor 2464. In the FIG. 17 configuration, the third and extra transistors 2446 and 2464 of the delay-out circuit 2450A are connected to each other in series between the drains of the first and second transistors 2442 and 2444 of the delay-out circuit 2450A and ground.

Figure 18:
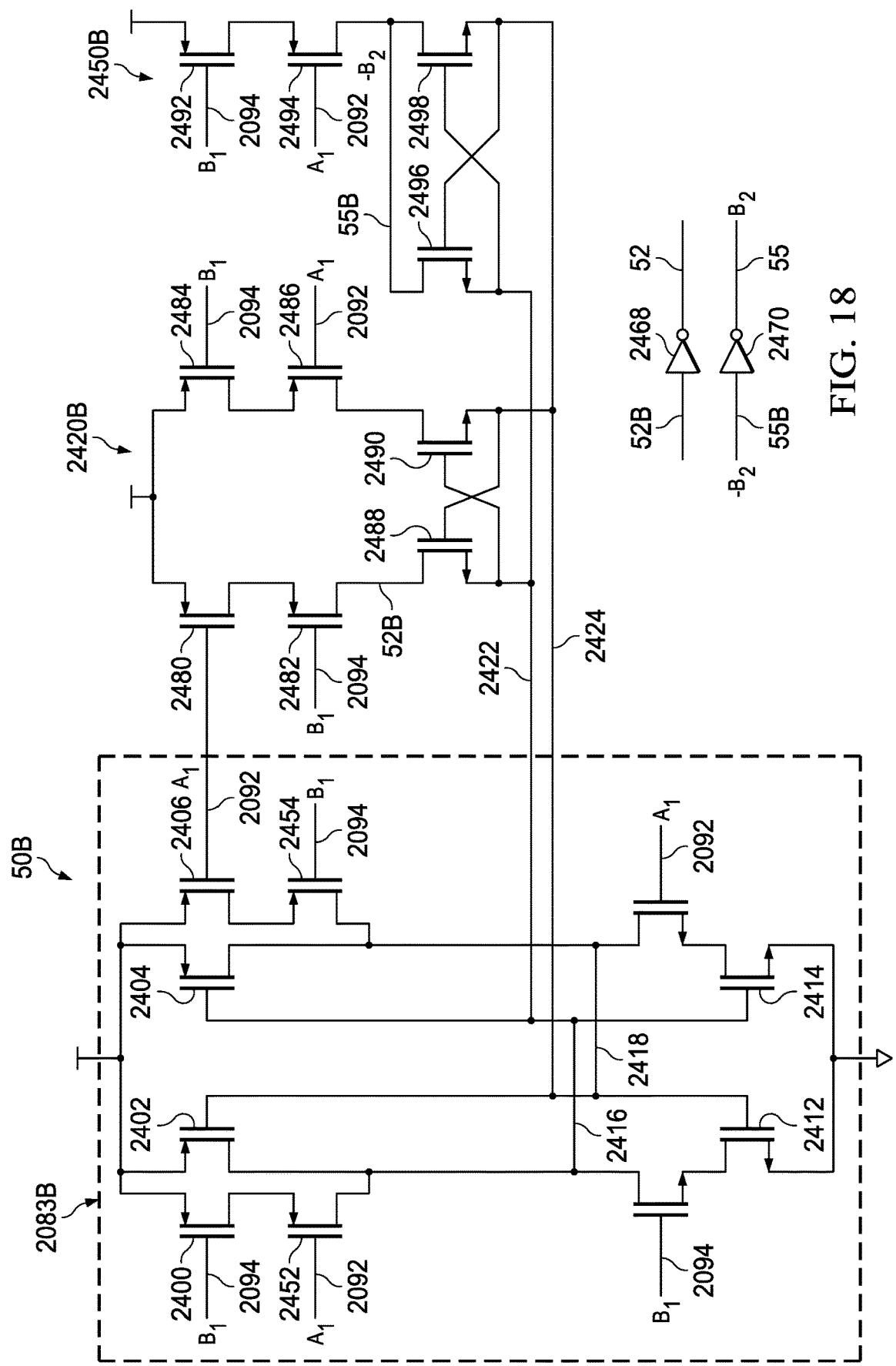

Whereas the merged clock-less comparator 50A illustrated in FIG. 17 has a P barrier configuration, a second merged clock-less comparator 50B illustrated in FIG. 18 has an N barrier configuration. The second clock-less delay comparator 50B is similar to the clock-less delay comparator 50A illustrated in FIG. 17 except that (1) the non-inverted input signals $A_1$ and $B_1$ are used to control the operation of inverted sign-out and inverted delay-out circuits 2420B and 2450B in the second clock-less delay comparator 50B, and (2) inverter gates 2468 and 2470 are used in the FIG. 18 configuration to generate the non-inverted sign signal on digital line 52 and the non-inverted delay signal $B_2$ on line 55.

As illustrated in FIG. 18, the inverted sign-out circuit 2420B, which is merged with the comparator circuit 2083B, has first, second, third, fourth, fifth and sixth transistors 2480, 2484, 2482, 2486, 2488 and 2490. The sources of the fifth and sixth transistors 2488, 2490 are electrically connected to the third and fourth conductive lines 2422 and 2424, respectively. The gates of the fifth and sixth transistors 2488 and 2490 are electrically connected to the fourth and third conductive lines 2424 and 2422, respectively. In operation, an inverted sign signal is generated within the inverted sign-out circuit 2420B, on line 52B.

The inverted sign signal on line 52B is inverted by one of the inverter gates 2468 to generate the non-inverted sign-out signal on line 52, which is applied to the calibration engine/processor 34 (not illustrated in FIG. 18). The non-inverted sign-out signal represents the order in which the input signals $A_1$ and $B_1$ arrive at the first and threshold inputs 2092 and 2094 of the second clock-less delay comparator 50B. The operation of the inverted sign-out circuit 2420B is controlled by the first and second input signals $A_1$ and $B_1$, which are applied to the first and fourth transistors 2480 and 2486, and to the second and third transistors 2484 and 2482, respectively, on the first and threshold inputs 2092 and 2094, respectively.

The first and second conductive lines 2416 and 2418 are electrically connected to the inverted delay-out circuit 2450B via the third and fourth conductive lines 2422 and 2424, respectively. The inverted delay-out circuit 2450B has first, second, third and fourth transistors 2492, 2494, 2496 and 2498. In operation, when the second clock-less delay comparator 50B is enabled, an inverted delay signal $-B_2$ is generated on line 55B. The inverted delay signal $-B_2$ is inverted by the second inverter 2470 to generate the non-inverted delay signal $B_2$. The timing of the leading edge of the non-inverted delay signal $B_2$ on line 55 relative to the timing of the earlier-arriving of the leading edges of the signals $A_1$ and $B_1$ on the comparator inputs 2092 and 2094 is the comparator delay.

As illustrated in FIG. 18, the sources of the third and fourth transistors 2496, 2498 of the inverted delay-out circuit 2450B are electrically connected to the third and fourth conductive lines 2422 and 2424, respectively. The gates of the third and fourth transistors 2496 and 2498 of the inverted delay-out circuit 2450B are electrically connected to the fourth and third conductive lines 2424 and 2422, respectively. The operation of the inverted delay-out circuit 2450B is controlled by both of the input signals $A_1$ and $B_1$, which are applied to the gates of the second and first transistors 2494 and 2492 of the inverted delay-out circuit 2450B. As illustrated in FIG. 18, the first and second transistors 2492 and 2494 of the inverted delay-out circuit 2450B are electrically connected to each other in series.

The present disclosure describes many advantageous features. Among other things, an algorithm has been described by which gain within two zones of a preamplifier can be normalized. The gain normalization may be performed by changing bulk voltage. Moreover, an iterative method of normalizing gain across the array 16, preferably using current kick to reduce response time, has been described. Moreover, a technique has been described herein for detecting a saturation condition of a voltage-to-delay preamplifier.

An advantageous feature described in this disclosure relates to the use of only a single-bit output to perform all calibration and adjustment processes. Moreover, the present disclosure describes a process for calculating gain of a preamplifier by, among other things, measuring delays of output signals using a delay-locked loop-generated signal. The present disclosure also describes a method of maximizing gains of preamplifiers by a combination of current adjustment and capacitance adjustment.

The analog-to-digital converter system 10 described herein may be incorporated into a radio-frequency sampling analog-to-digital converter with high operational speed and performance, and low power usage. The system 10 may be incorporated into a highly integrated radio-frequency sampling based transceiver for use in wireless infrastructure, especially for higher bandwidth multi-band applications. Among other things, devices constructed in accordance with the present disclosure may have low power consumption and small area requirements.

In general, it is possible to reduce non-linearity in certain devices by over-designing the devices. However, the over-design approach tends to undesirably increase area and power requirements, sometimes drastically, especially to accommodate a wide range of temperatures. And over-designing may not be scalable at lower process nodes, since the analog domain at such nodes tends to be more non-linear. Moreover, in general, it may be possible to perform calibration using a factory trim process. However, it may be difficult to trim later stages of an analog-to-digital device where such stages operate in a highly non-linear manner. It may not be possible to track changes, especially in the later stages, as needed for a factory trim process.

The present disclosure represents an improvement over the concept of reducing non-linearity by over-design, because over-design may increase area and power drastically to support wider temperature, and is not scalable at lower process nodes where analog processing is more non-linear. Methods performed in connection with the present disclosure may also represent an improvement over factory-trimming processes, which may still require over-design since trimming is not accurate and cannot track temperature.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A method of using an analog-to-digital converter system that includes a delay comparator incorporated into a delay-resolving delay-to-digital backend, the delay-resolving delay-to-digital backend is coupled to preamplifiers and the method is comprising:
   receiving a sampled voltage corresponding to one of an input voltage and a known voltage;
   causing the preamplifiers to generate output signals based on the sampled voltage;
   generating first and second signals based on the output signals;
   causing the delay-resolving delay-to-digital backend to generate a single-bit digital signal representing an order of receipt of the first and second signals;
   adjusting one or more of the preamplifiers based on the single-bit digital signal.

2. The method of claim 1, wherein the method includes causing the comparator to generate the single-bit digital signal.

3. The method of claim 2, further comprising causing the comparator to transmit a residue delay signal to a succeeding delay comparator.

4. The method of claim 2, further comprising the step of using a delay-locked loop (DLL) line to apply delay signals of different values to the comparator to measure gain of the preamplifiers.

5. The method of claim 2, further comprising measuring gain of the preamplifiers by using a digital code output of the delay-resolving delay-to-digital backend for different known calibration voltages.

6. The method of claim 4, further comprising adjusting voltage of the preamplifiers to normalize gain between zones of the preamplifiers.

7. The method of claim 2, further comprising adjusting current through the preamplifiers to normalize gain across the preamplifiers.

8. The method of claim 2, further comprising applying current kick to the preamplifiers, and subsequently increasing capacitance and thereby increasing gain, of one of the preamplifiers.

9. The method of claim 2, further comprising detecting a saturation condition in the preamplifiers by monitoring the first and second signals.

10. The method of claim 2, further comprising causing a folding multiplexer to transmit delay signals, based on the output signals, to delay multiplexers, and causing delay multiplexers to generate the first and second signals based on the delay signals and a delay signal generated by a delay-locked loop.

11. The method of claim 2, further comprising decreasing current common to the preamplifiers to increase gain based on the single-bit digital signal.

12. The method of claim 2, wherein the adjusting includes correcting threshold voltages of the preamplifiers, and wherein the method further includes increasing gain of each of the preamplifiers, improving normalization of gains of first and second zones of each of the preamplifiers, and improving normalization of gain across the preamplifiers.

13. The method of claim 2, further comprising increasing capacitance of one of the preamplifiers to increase gain of that preamplifier, based on the single-bit digital signal.

14. An analog-to-digital converter system comprising:
   a voltage-to-delay frontend having:
      a sampled voltage input corresponding to one of an input voltage and a known voltage;
      preamplifiers, each preamplifier having an output based on the sampled voltage; and
      a folding multiplexer having an input connected to the output of each preamplifier and having a first delay signal output and second delay signal output, the first delay signal output and the second delay signal output are based on the output of one of the preamplifiers; and
   a delay-resolving delay-to-digital backend having:
      a first delay multiplexer having an output, a first input connected to the first delay signal output and a second input connected to a DLL signal;
      a second delay multiplexer having an output, a first input connected to the second delay signal output and a second input connected to the DLL signal; and
      a delay comparator having a first input connected to the output of the first delay multiplexer and a second input connected to the output of the second delay multiplexer.

15. The analog-to-digital converter system of claim 14, further comprising a digital-to-analog converter, connected to the frontend, for generating the known voltage.

16. The analog-to-digital converter system of claim 15, further comprising a multiplexer, connected to the digital-to-analog converter, for transmitting one of the input voltage and the known voltage to the preamplifiers as the sampled voltage.

17. The analog-to-digital converter system of claim 14, wherein the preamplifiers have different threshold voltages.

18. The analog-to-digital converter system of claim 14, wherein the preamplifiers are configured to provide a digital signal to a calibration engine/processor.

19. The analog-to-digital converter system of claim 18, wherein the delay comparator is configured to provide a digital signal to the calibration engine/processor representative of the order of arrival of the first and second inputs.

20. The analog-to-digital converter system of claim 19, wherein the delay comparator is configured to transmit a residue delay signal to a succeeding delay comparator.

21. A method of operating an analog-to-digital converter system that includes a delay comparator incorporated into a delay-resolving delay-to-digital backend, the delay-resolving delay-to-digital backend is coupled to a delay-based preamplifier array and the method is comprising:

receiving, by the delay-based preamplifier array, a sampled voltage corresponding to one of an input voltage and a known voltage, wherein the preamplifier array includes preamplifiers having different threshold voltages;

generating, by the delay-based preamplifier array, output signals based on the sampled voltage;

generating first and second signals based on the output signals;

receiving the first and second signals, by the delay comparator;

generating, by the delay comparator, a single-bit digital signal representing an order of receipt of the first and second signals;

transmitting, by the delay comparator, a residue delay signal to a succeeding delay comparator; and subsequently, transmitting, by a calibration engine/processor, a signal to the preamplifiers to adjust one or more of the preamplifiers based on the single-bit digital signal.

22. The method of claim 21, further comprising causing the calibration engine/processor to generate a digital output signal representative of the input voltage, based on signals generated by the preamplifier array and the analog-to-digital converter backend.

* * * * *